US009419069B2

(12) United States Patent
Holland et al.

(10) Patent No.: US 9,419,069 B2
(45) Date of Patent: Aug. 16, 2016

(54) METHOD OF MANUFACTURING A SEMICONDUCTOR COMPONENT AND STRUCTURE

(71) Applicant: Semiconductor Components Industries, LLC, Phoenix, AZ (US)

(72) Inventors: Phillip Holland, Los Gatos, CA (US); Rong Liu, San Jose, CA (US); Umesh Sharma, San Jose, CA (US); David D Marreiro, Oakland, CA (US); Der Min Liou, San Jose, CA (US); Sudhama C Shastri, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/317,739

(22) Filed: Jun. 27, 2014

(65) Prior Publication Data

US 2014/0308795 A1    Oct. 16, 2014

Related U.S. Application Data

(63) Continuation of application No. 12/896,416, filed on Oct. 1, 2010, now Pat. No. 8,766,401.

(51) Int. Cl.
*H01L 21/20* (2006.01)
*H01L 49/02* (2006.01)
*H01L 23/522* (2006.01)
*H01L 23/532* (2006.01)

(52) U.S. Cl.
CPC ............ *H01L 28/10* (2013.01); *H01L 23/5227* (2013.01); *H01L 23/53223* (2013.01); *H01L 23/53238* (2013.01); *H01L 23/53252* (2013.01); *H01L 2924/0002* (2013.01)

(58) Field of Classification Search
CPC ................... H01L 23/5227; H01L 23/53223; H01L 23/53238; H01L 23/53252; H01L 28/10
USPC ............................ 257/528, 532; 438/329, 381
See application file for complete search history.

(56) References Cited

U.S. PATENT DOCUMENTS

| 4,953,002 | A  | 8/1990  | Nelson et al. |
| 5,051,667 | A  | 9/1991  | Dunham |
| 6,114,937 | A  | 9/2000  | Burghartz et al. |
| 6,396,032 | B1 | 5/2002  | Denny et al. |
| 6,833,627 | B2 | 12/2004 | Farnworth |
| 6,876,285 | B2 | 4/2005  | Liang et al. |

(Continued)

FOREIGN PATENT DOCUMENTS

| JP | 08203737   | 8/1996 |
| JP | 2002-101505 | 4/2002 |
| JP | 2006140229 | 6/2006 |

OTHER PUBLICATIONS

Sunderarajan S. Mohan, et al., Modeling and Characterization of On-Chip Transformers, IEEE, IEDM 98, Sep. 1998, 531-534.
ON Semiconductor, NUC2401MN Integrated Common Mode Choke with Integrated ESD Protection, Mar. 2009—Rev. 0. www.onsemi.com.
ON Semiconductor, NUC2401MN Integrated Common Mode Choke with Integrated ESD Protection, May 2009—Rev. 1. www.onsemi.com.

(Continued)

*Primary Examiner* — Hung Vu
(74) *Attorney, Agent, or Firm* — Rennie William Dover

(57) ABSTRACT

A semiconductor component and methods for manufacturing the semiconductor component that includes a three dimensional helically shaped common mode choke. In accordance with embodiments, a transient voltage suppression device may be coupled to the monolithically integrated common mode choke.

6 Claims, 31 Drawing Sheets

(56) References Cited

U.S. PATENT DOCUMENTS

| | | |
|---|---|---|
| 6,906,369 B2 | 6/2005 | Ross et al. |
| 7,088,215 B1 | 8/2006 | Winter et al. |
| 7,396,701 B2 | 7/2008 | Shigemura et al. |
| 7,414,508 B2 | 8/2008 | Okuzawa et al. |
| 7,547,992 B2 | 6/2009 | Hiyama |
| 8,022,552 B2 * | 9/2011 | Lin et al. ............... 257/773 |
| 8,050,045 B2 | 11/2011 | Okuzawa et al. |
| 8,063,480 B2 | 11/2011 | Mukaibara |
| 8,514,596 B2 | 8/2013 | Koyama et al. |
| 2003/0086718 A1 | 5/2003 | Birumachi |
| 2003/0205778 A1 | 11/2003 | Yeo et al. |
| 2005/0258509 A1 | 11/2005 | Horikawa et al. |
| 2005/0285262 A1 | 12/2005 | Knapp et al. |
| 2006/0001520 A1 | 1/2006 | Kaji et al. |
| 2006/0068602 A1 | 3/2006 | Kamijima |
| 2007/0040163 A1 | 2/2007 | Okuzawa et al. |
| 2007/0075819 A1 | 4/2007 | Okuzawa |
| 2007/0200218 A1 | 8/2007 | Mukaibara |
| 2008/0297964 A1 | 12/2008 | Hiyama |
| 2009/0315142 A1 * | 12/2009 | Burke et al. ............ 257/528 |
| 2010/0052838 A1 | 3/2010 | Matsuta et al. |

OTHER PUBLICATIONS

ON Semiconductor, ON Semiconductor Introduces Industry's First Common Mode Choke EMI Filter with Integrated ESD Protection for High-Speed Data Lines, Press Release Phoenix, Arizona, May 27, 2009, www.onsemi.com.

ON Semiconductor, ON Semiconductor Introduces Industry's First Common Mode Choke EMI Filter with Integrated ESD Protection for High-Speed Data Lines, Press Release May 27, 2009, www.businesswire.com.

ON Semiconductor, ON Semiconductor Introduces Industry's First Common Mode Choke EMI Filter with Integrated ESD Protection for High-Speed Data Lines, Press Release May 27, 2009, www.tradingmarkets.com.

ON Semiconductor, ON Semiconductor Introduces Industry's First Common Mode Choke EMI Filter with Integrated ESD Protection for High-Speed Data Lines, Press Release Jun. 1, 2009. http://www.ctimes.com.tw/DispProduct/en/EMI-filter/ON-Semiconductor/0906012227CS.shtml.

* cited by examiner

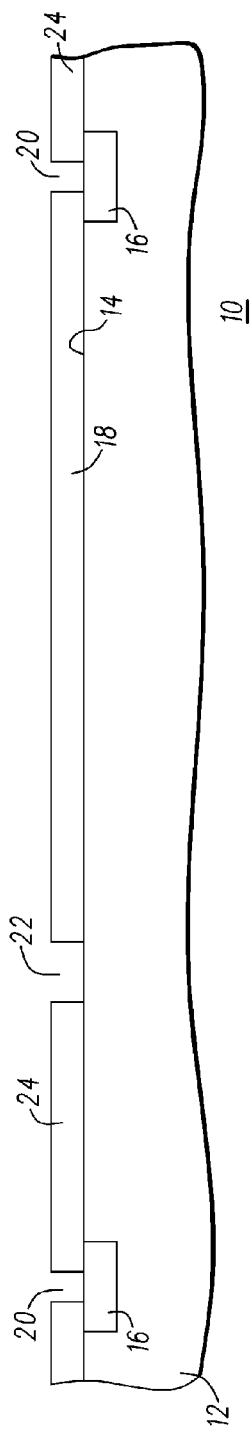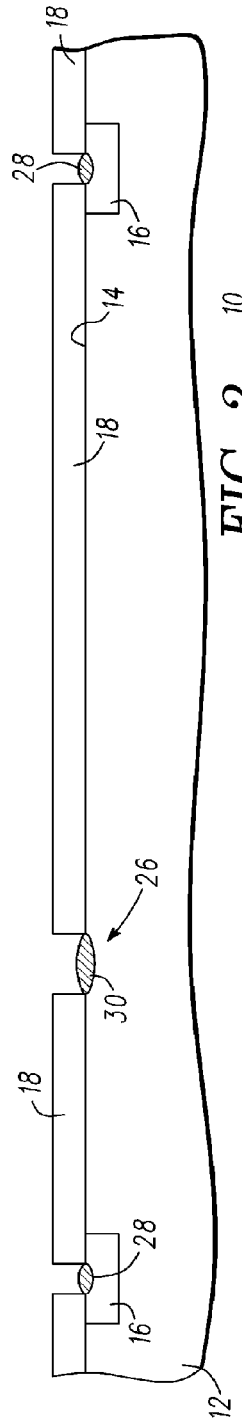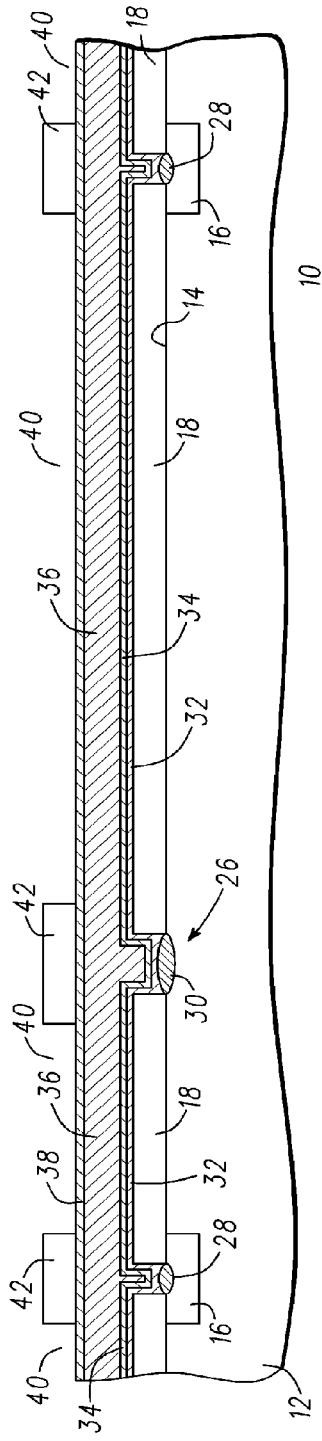

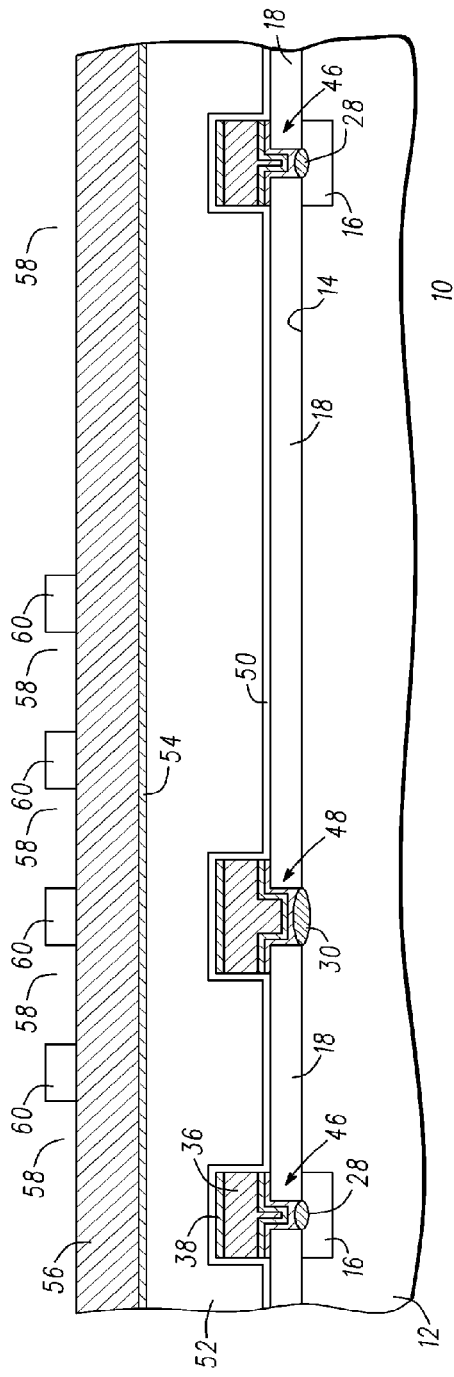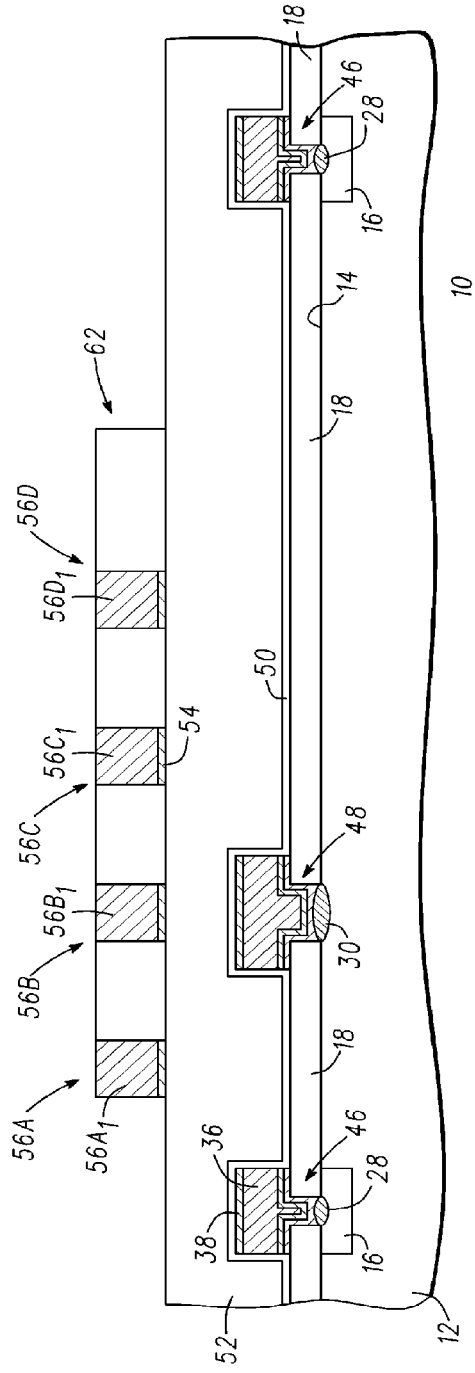

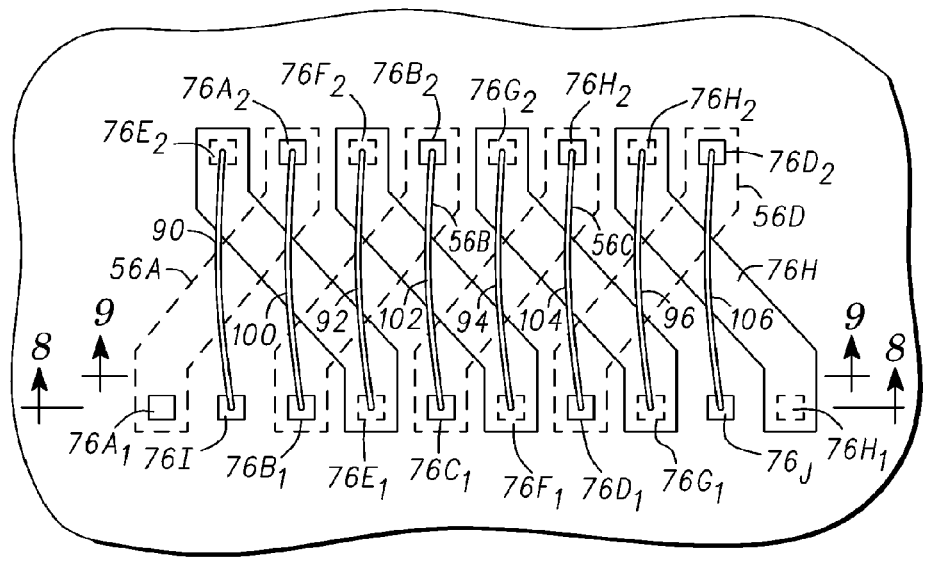
FIG. 12
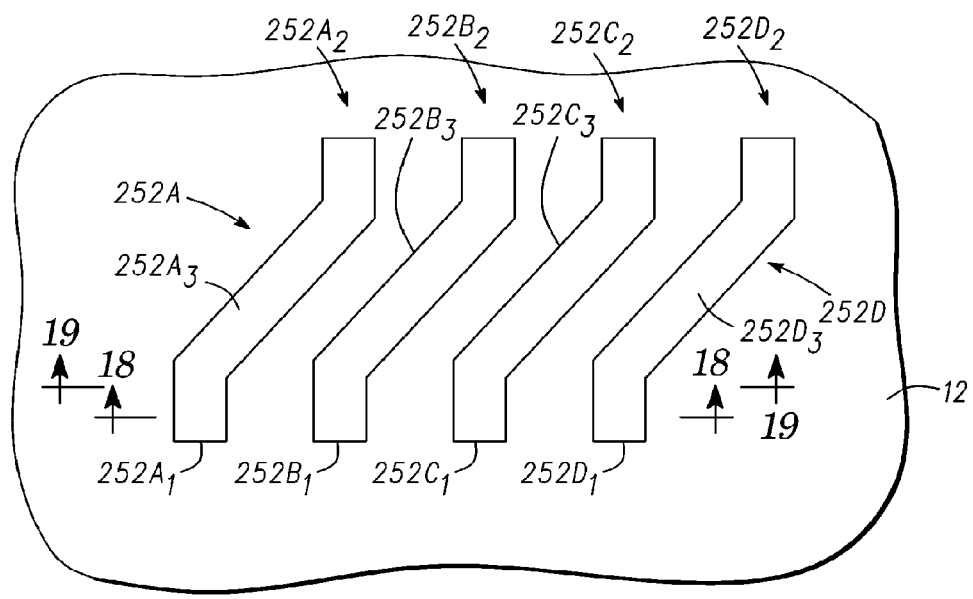
FIG. 17    200

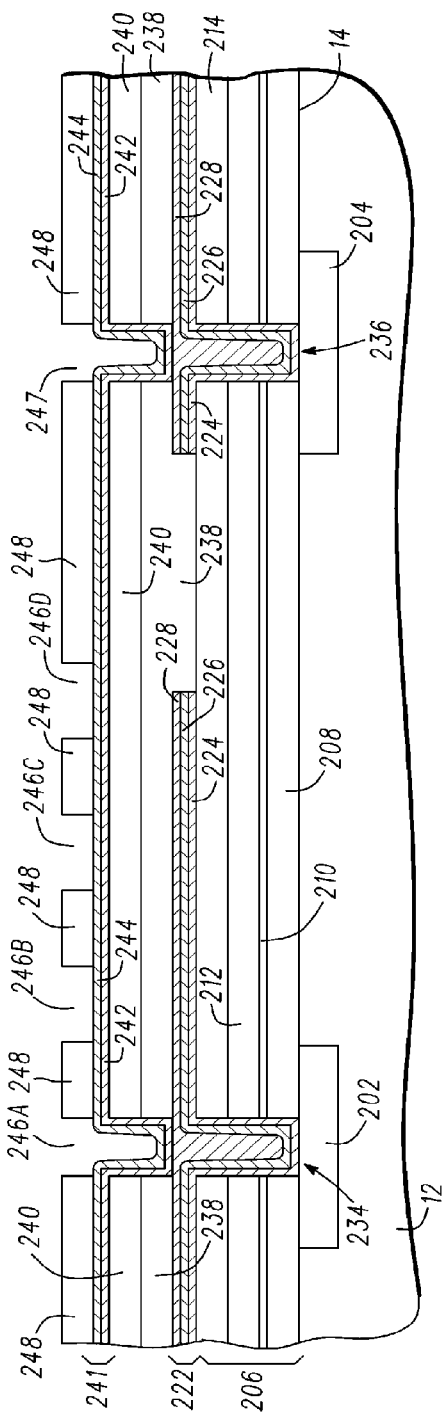
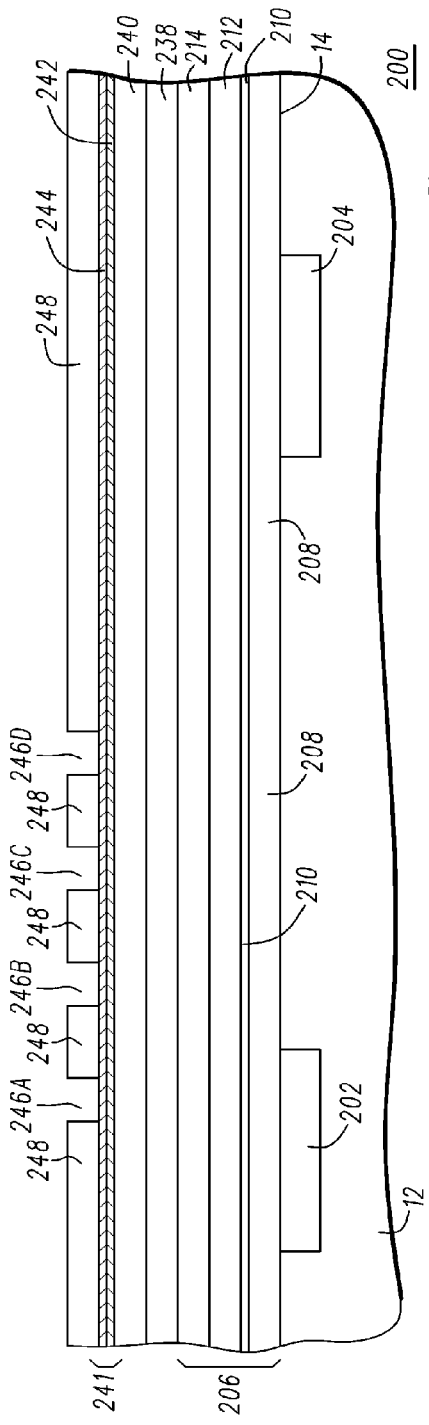

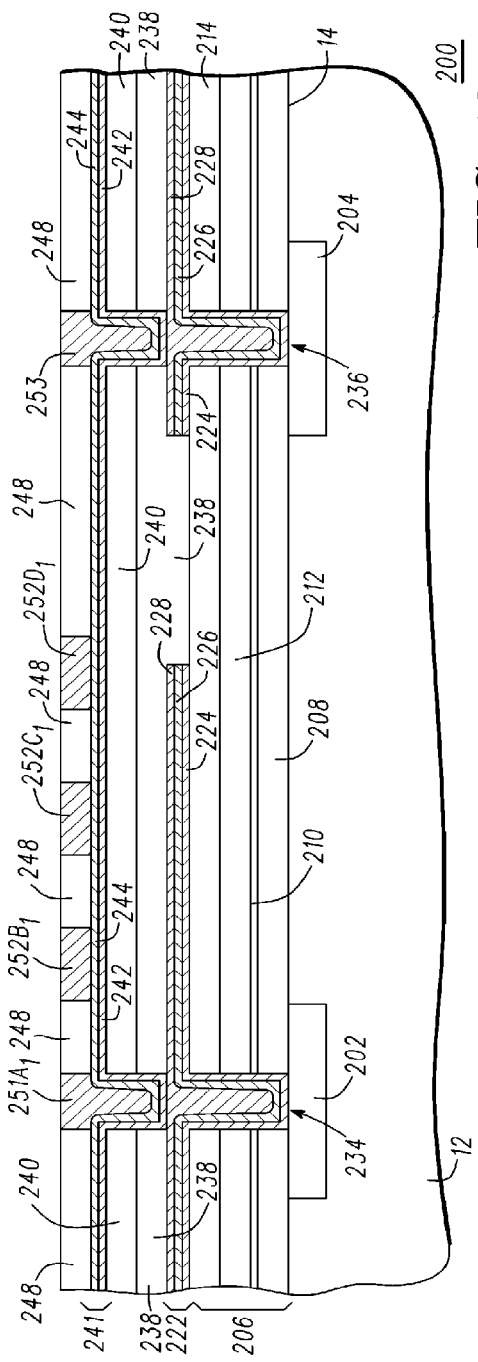
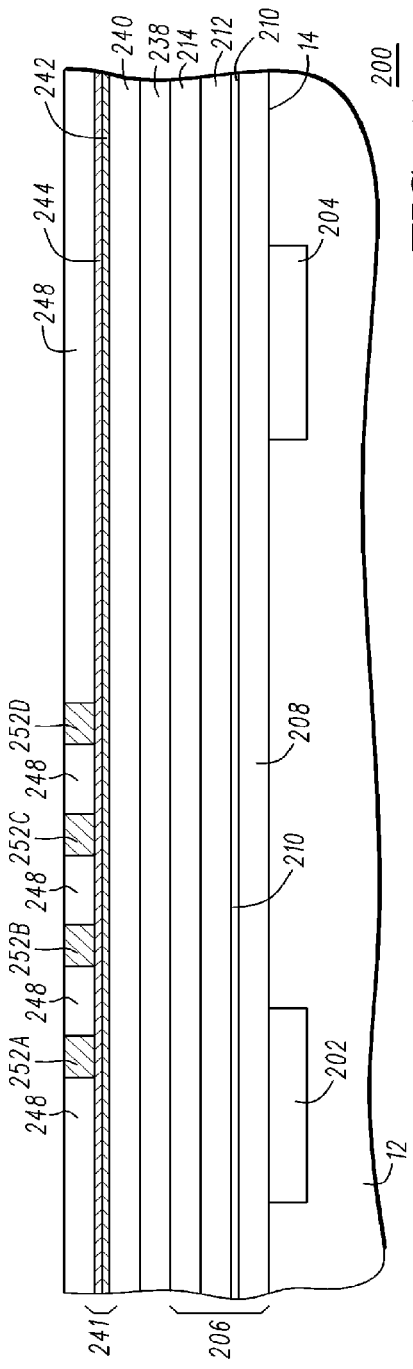
FIG. 18
FIG. 19

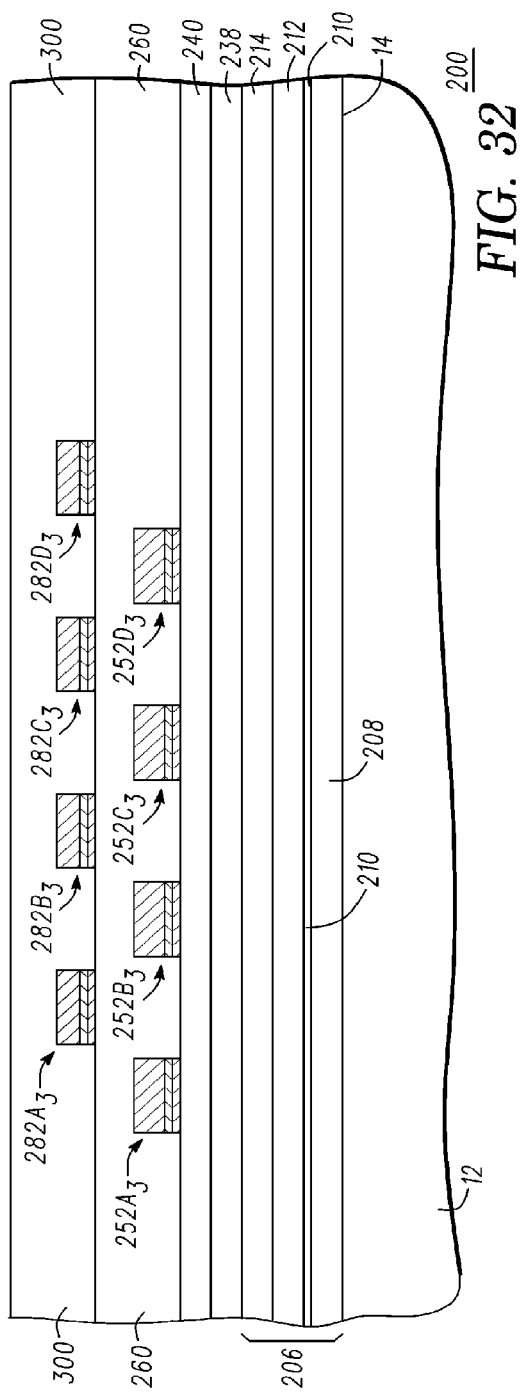
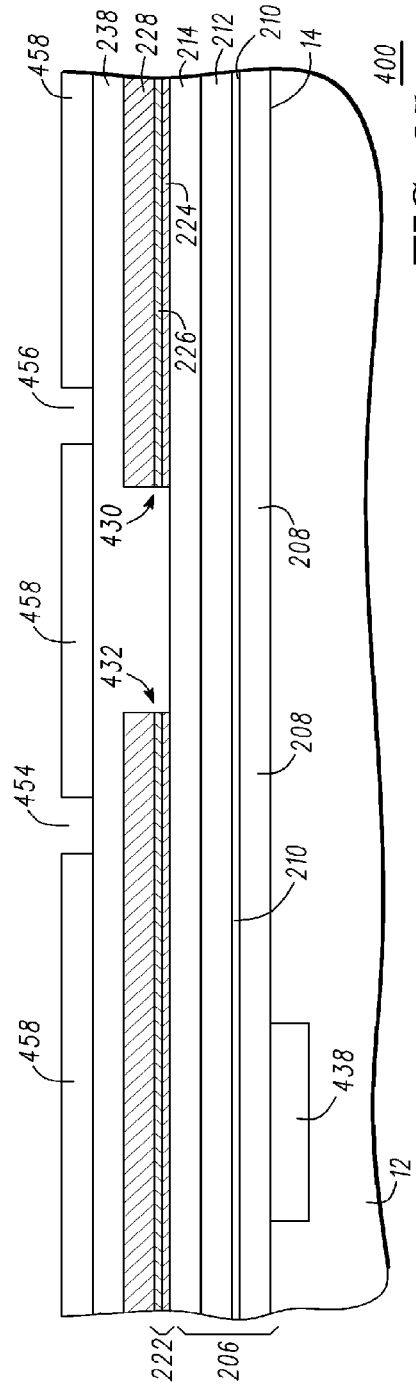

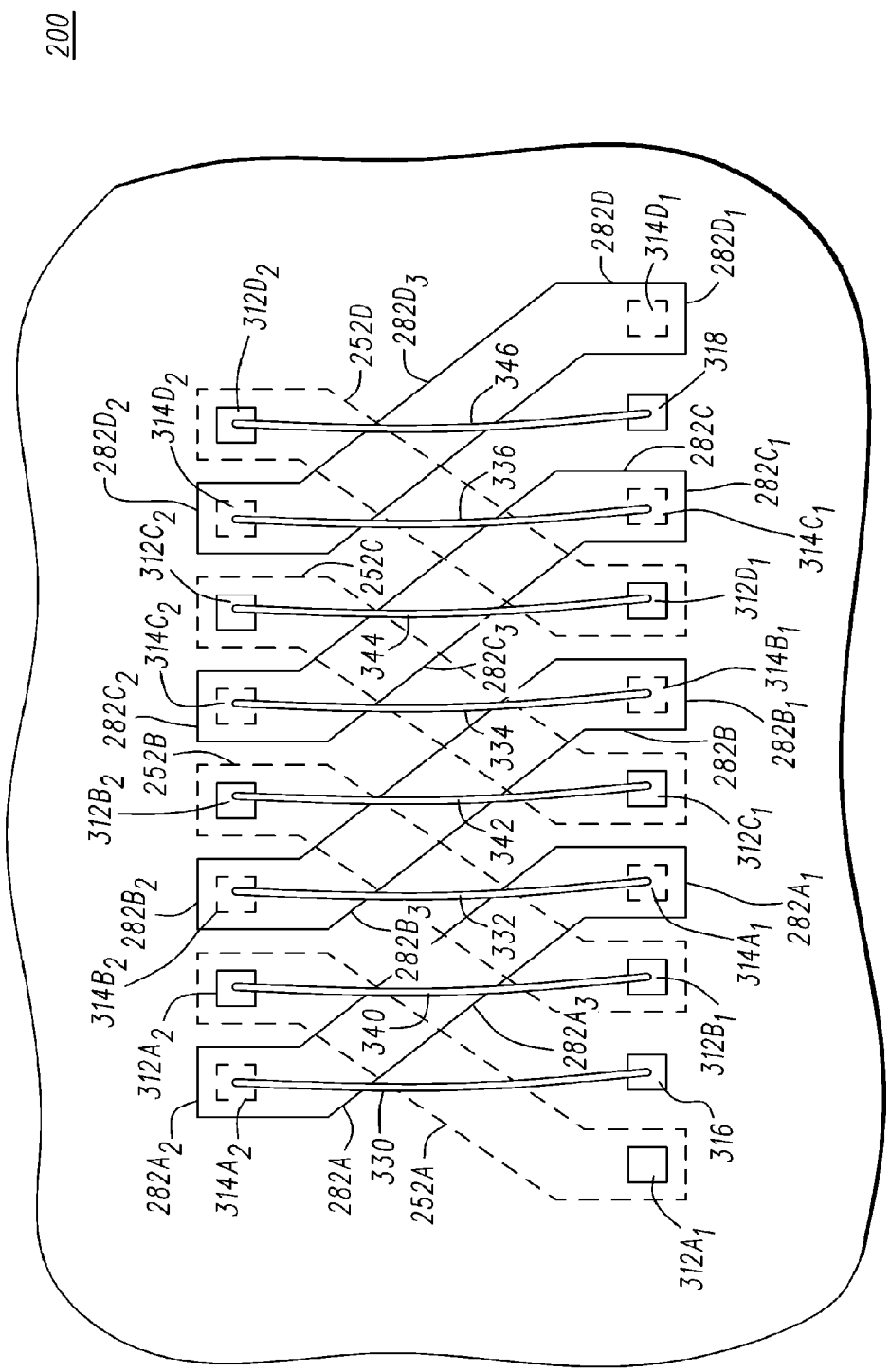

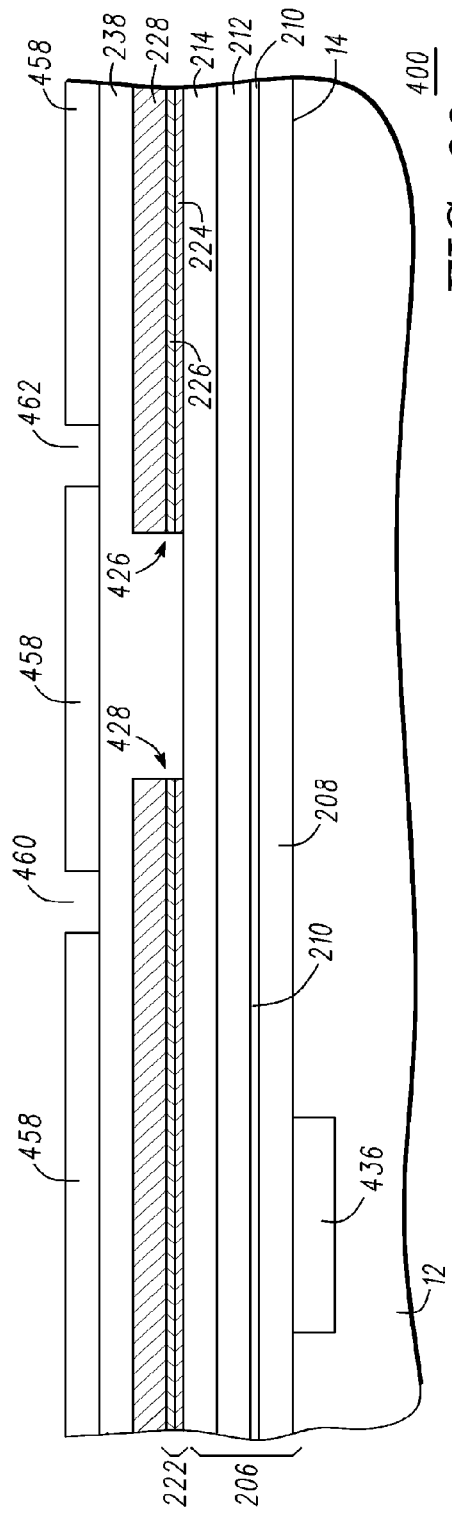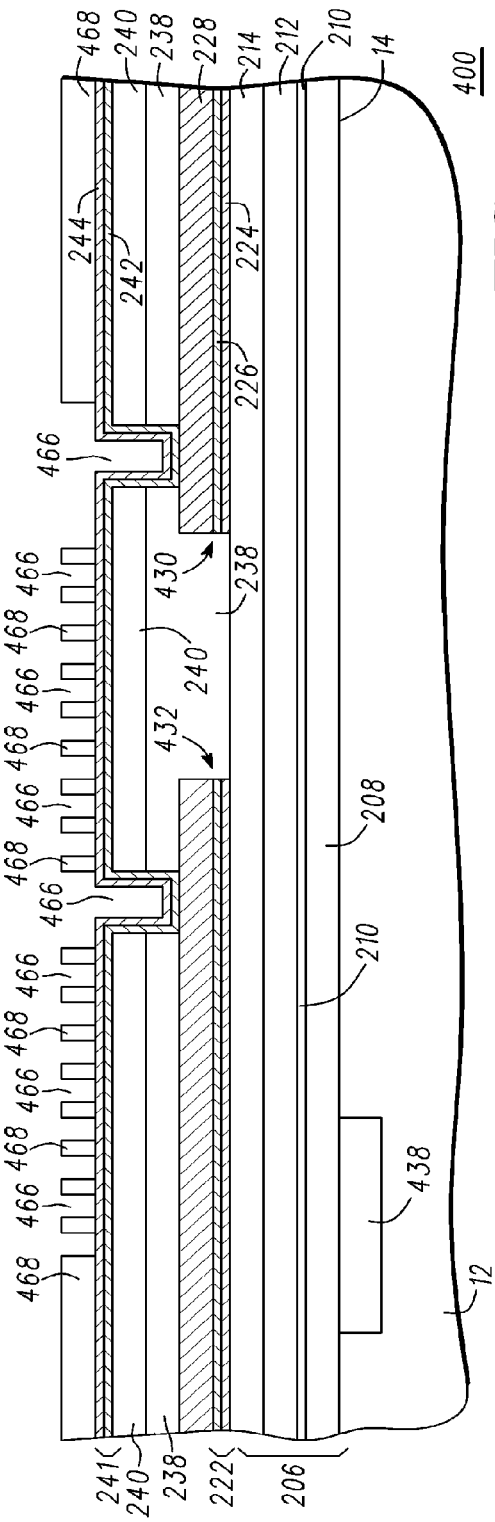

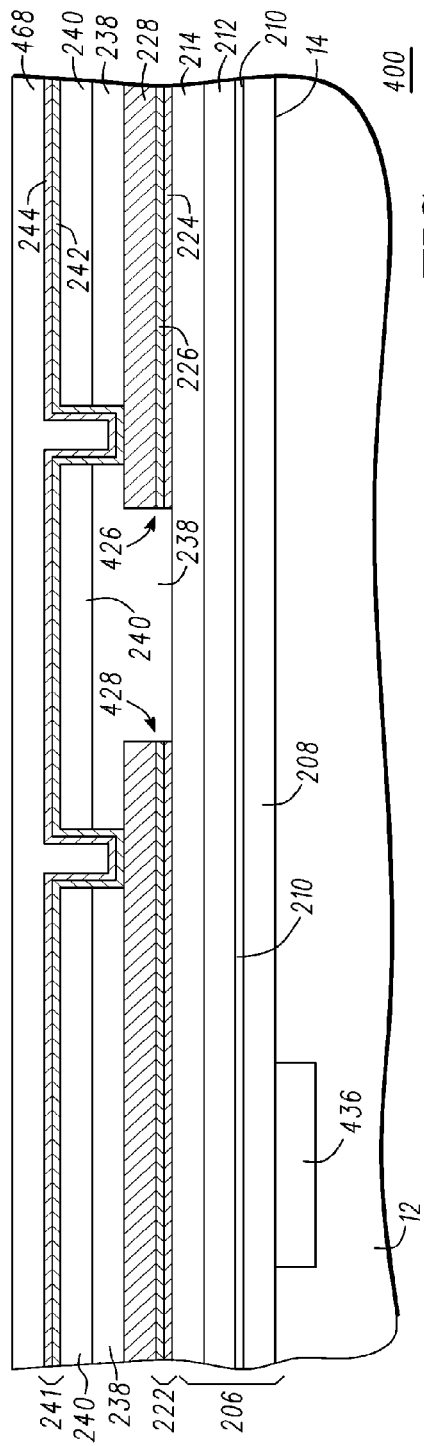
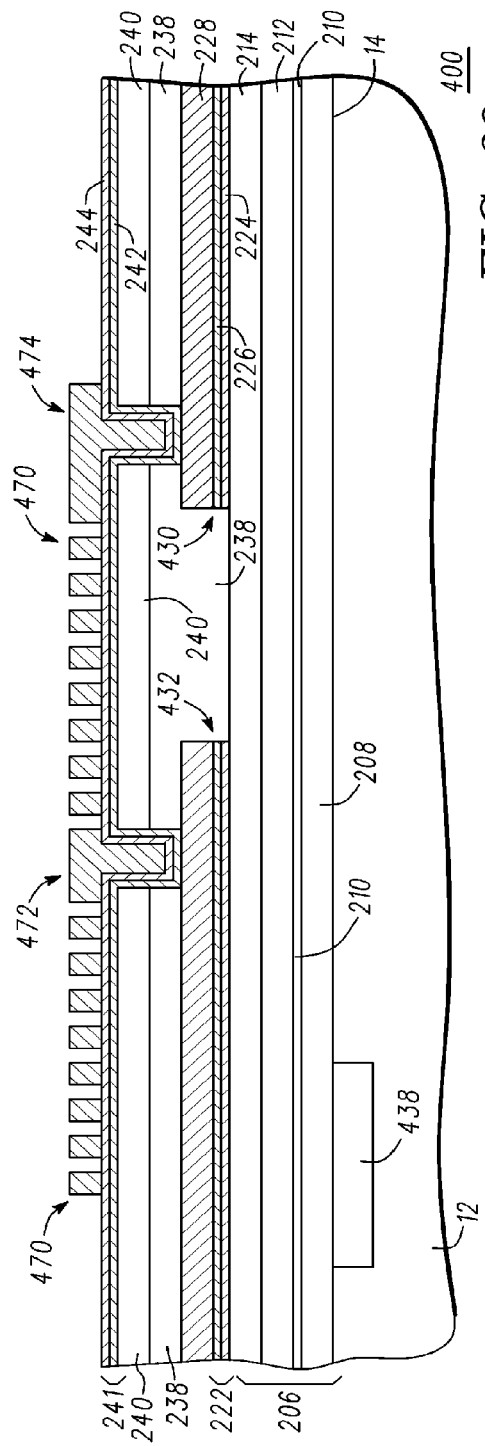

METHOD OF MANUFACTURING A SEMICONDUCTOR COMPONENT AND STRUCTURE

The present application is a continuation application of U.S. patent application Ser. No. 12/896,416 filed on Oct. 1, 2010, by Phillip Holland et al., titled "METHOD OF MANUFACTURING A SEMICONDUCTOR COMPONENT AND STRUCTURE" which is hereby incorporated by reference in its entirety, and priority thereto for common subject matter is hereby claimed.

TECHNICAL FIELD

The present invention relates, in general, to semiconductor components and, more particularly, to signal transmission in semiconductor components.

BACKGROUND

Transmission protocols within communications systems may include the use of single-ended signals, differential signals, or combinations of single-ended and differential signals. For example, single-ended signals and differential signals are suitable for use in portable communications systems that employ low speed data transmission. However, in communications systems that employ high speed data transmission such as in Universal Serial Bus (USB) applications, it is desirable to use differential signals because of their noise immunity properties.

Accordingly, it would be advantageous to have a structure and method for maintaining the amplitude and phase of a differential signal, while filtering out spurious common-mode signals introduced by, for example, transmission line effects. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 1 is a cross-sectional view of a semiconductor component at an early stage of manufacture in accordance with an embodiment of the present invention;

FIG. 2 is a cross-sectional view of the semiconductor component of FIG. 1 at a later stage of manufacture;

FIG. 3 is a cross-sectional view of the semiconductor component of FIG. 2 at a later stage of manufacture;

FIG. 4 is a cross-sectional view of the semiconductor component of FIG. 3 at a later stage of manufacture;

FIG. 5 is a cross-sectional view of the semiconductor component of FIG. 4 taken along the region of section line 5-5 in FIG. 6;

FIG. 12 is top view of the semiconductor component of FIG. 11 at a later stage of manufacture;

FIG. 15 is a cross-sectional view of the semiconductor component of FIG. 14 at a later stage of manufacture;

FIG. 16 is a cross-sectional view of a semiconductor component of FIG. 17 taken along section line 19-19 of FIG. 17, but at an earlier stage of manufacture;

FIG. 17 is a top view of the semiconductor component of FIGS. 16, 18, and 19;

FIG. 18 is a cross-sectional view of the semiconductor component of FIG. 17 taken along section line 18-18;

FIG. 19 is a cross-sectional view of the semiconductor component of FIG. 17 taken along section line 19-19;

FIG. 32 is a cross-sectional view taken along section line 32-32 of FIG. 30;

FIG. 33 is a top view of the semiconductor component of FIGS. 31 and 32 at a later stage of manufacture;

FIG. 35 is a cross-sectional view of the semiconductor component of FIG. 34 taken along section line 35-35 of FIG. 34 but at an earlier stage of manufacture;

FIG. 36 is a cross-sectional view of the semiconductor component of FIG. 34 taken along section line 36-36 of FIG. 34 but at an earlier stage of manufacture;

FIG. 37 is a cross-sectional view of the semiconductor component of FIG. 35 at a later stage of manufacture;

FIG. 38 is a cross-sectional view of the semiconductor component of FIG. 36 at a later stage of manufacture;

FIG. 39 is a cross-sectional view of the semiconductor component of FIG. 37 at a later stage of manufacture;

Figure 6:
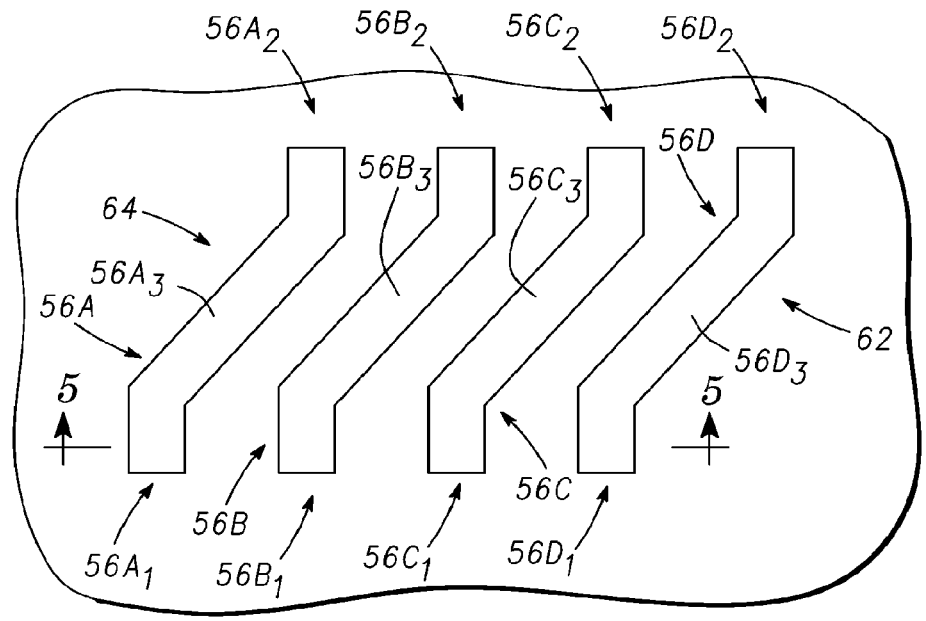
FIG. 6 is a top view of the semiconductor component of FIG. 4 at a later stage of manufacture.

For simplicity and clarity of the illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION

FIG. 1 is a cross-sectional view of an integrated common mode choke 10 at a beginning stage of manufacture in accordance with an embodiment of the present invention. What is shown in FIG. 1 is a semiconductor material 12 having a major surface 14. In accordance with an embodiment, semiconductor material 12 is silicon doped with an impurity material of P-type conductivity such as, for example, boron. By way of example, the resistivity of semiconductor material 12 ranges from about 0.001 Ohm-centimeters ($\Omega$-cm) to about 10,000 $\Omega$-cm. Although semiconductor material 12 may be a high resistivity substrate, the resistivity or dopant concentration of semiconductor material 12 is not a limitation. Likewise, semiconductor 12 is not limited to being a silicon substrate and the conductivity type of substrate 12 is not limited to being P-type conductivity. It should be understood that an impurity material is also referred to as a dopant or impurity species. Other suitable materials for substrate 12 include polysilicon, germanium, silicon germanium, Semiconductor-On-Insulator ("SOI") material, an epitaxial layer formed on a bulk silicon material, and the like. In addition, substrate 12 can be comprised of a compound semiconductor material such as Group III-V semiconductor materials, Group II-VI semiconductor materials, etc.

Optionally, a transient voltage suppression structure 16 may be formed from substrate 12.

A layer of dielectric material 18 having a thickness ranging from about 1,000 Angstroms (Å) to about 60,000 Å is formed on surface 14. In accordance with an embodiment, dielectric material 18 is formed by the decomposition of tetraethylorthosilicate ("TEOS") to form an oxide layer having a thickness of about 8,000 Å. A dielectric layer formed in this manner is typically referred to as TEOS or a TEOS layer. The type of material for dielectric layer 18 is not a limitation of the present invention. A layer of photoresist is formed on TEOS layer 18 and patterned to have openings 20 and 22 that expose portions of TEOS layer 18. The remaining portions of the photoresist layer serve as a masking structure 24.

Referring now to FIG. 2, openings are formed in the exposed portions of dielectric layer 18 using, for example, an anisotropic reactive ion etch. The openings expose portions of transient voltage suppression structures 16 formed in semiconductor substrate 12 and portion 26 of substrate 12. Masking structure 24 is removed. A layer of refractory metal (not shown) is conformally deposited over the exposed portions of transient voltage suppression structures 16, portion 26 of substrate 12, and over dielectric layer 18. By way of example, the refractory metal is nickel, having a thickness ranging from about 50 Å to about 150 Å. The refractory metal is heated to a temperature ranging from about 350 degrees Celsius (° C.) to about 500° C. The heat treatment causes the nickel to react with the silicon to form nickel silicide (NiSi) in all regions in which the nickel is in contact with silicon. Thus, nickel silicide regions 28 are formed from portions of transient voltage suppression structures 16 and a nickel silicide region 30 is formed from portion 26 of substrate 12. The portions of the nickel over dielectric layer 18 remain unreacted. After formation of the nickel silicide regions, any unreacted nickel is removed. It should be understood that the type of silicide is not a limitation of the present invention. For example, other suitable silicides include titanium silicide (TiSi), platinum silicide (PtSi), cobalt silicide ($CoSi_2$), or the like. As those skilled in the art are aware, silicon is consumed during the silicide formation and the amount of silicon consumed is a function of the type of silicide being formed.

Referring now to FIG. 3, layer of titanium 32 having a thickness ranging from about 25 Å to about 200 Å is formed on dielectric layer 18 and in the openings formed in dielectric layer 18. A layer of titanium nitride 34 having a thickness ranging from about 75 Å to about 600 Å is formed on titanium layer 32. A layer of aluminum 36 having thickness ranging from about 5,000 Å to about 40,000 Å is formed on titanium nitride layer 34. By way of example aluminum layer 36 has a thickness of about 20,000 Å. A layer of titanium nitride 38 having a thickness ranging from about 400 Å to about 900 Å is formed on aluminum layer 36. Layers 32, 34, 36, and 38 may be formed using Chemical Vapor Deposition ("CVD"), Plasma Enhanced Chemical Vapor Deposition ("PECVD"), sputtering, evaporation, or the like. It should be understood that the materials of layers 32, 34, and 36 are not limitations of the present invention. Other suitable materials for layer 32 include tantalum, tungsten, platinum, a refractory metal compound, a refractory metal carbide, a refractory metal boride, or the like. Other suitable materials for layer 34 include, tantalum nitride, a metal nitride doped with carbon, a metal nitride doped with silicon, or the like. Other suitable materials for layer 36 include gold, silver, an aluminum alloy, or the like.

A layer of photoresist is formed on titanium nitride layer 38 and patterned to have openings 40 that expose portions of titanium nitride layer 38. The remaining portions of the photoresist layer serve as a masking structure 42.

Referring now to FIG. 4, the exposed portions of titanium nitride layer 38 and the portions of layers 36, 34, and 32 under the exposed portions of titanium nitride layer 38 are anisotropically etched using, for example, a reactive ion etch. Dielectric layer 18 serves as an etch stop layer. After anisotropically etching layers 38, 36, 34, and 32, contacts 46 remain that are in contact with transient voltage suppression regions 16, and a contact 48 remains in contact with, for example, an active device formed from substrate 12. For the sake of clarity, contacts 46 and 48 are shown as being comprised of a single material. However, it should be understood that contacts 46 and 48 are comprised of portions of layers 32-38.

A passivation layer 50 having a thickness ranging from about 0.1 micrometers (μm) to about 3 μm is formed on dielectric layer 18 and contacts 46 and 48. Suitable materials for passivation layer 50 include silicon oxide, silicon nitride, or the like. A layer of dielectric material 52 having a thickness ranging from about 1 μm to about 20 μm is formed on passivation layer 50. By way of example, layer 52 is a TEOS layer. A seed layer 54 having a thickness ranging from about 100 Å to about 1 μm is formed on dielectric material 52. By way of example, seed layer 54 is a titanium copper layer. A layer of electrically conductive material 56 such as, for example, copper having a thickness ranging from about 1 μm to about 20 μm is formed on seed layer 54. A layer of photoresist is formed on copper layer 56 and patterned to have openings 58 that expose portions of copper layer 56. The remaining portions of the photoresist layer serve as a masking structure 60.

Referring now to FIG. 5, the exposed portions of electrically conductive layer 56 are anisotropically etched using, for example, a reactive ion etch and an etch chemistry that preferentially etches, for example, copper. The etch stops on dielectric layer 52. After the etch, portions 56A, 56B, 56C, and 56D of electrically conductive layer 56 remain forming a portion 62 of a coil or inductor 64. It should be noted that FIG. 5 is a cross-sectional view taken along section line 5-5 of FIG. 6 and that reference characters $56A_1$, $56B_1$, $56C_1$, and $56D_1$ are further described with reference to FIG. 6. Masking structure 60 is removed.

Referring now to FIG. 6, a top view of portions 56A, 56B, 56C, and 56D of inductor 64 is illustrated. Portion 56A includes end regions $56A_1$ and $56A_2$ and a body region $56A_3$, portion 56B includes end regions $56B_1$ and $56B_2$ and a body region $56B_3$, portion 56C includes end regions $56C_1$ and $56C_2$ and a body region $56C_3$, and portion 56D includes end regions $56D_1$ and $56D_2$ and a body region $56D_3$. It should be noted that in cross section end regions $56A_2$, $56B_2$, $56C_2$, and $56D_2$ look similar to end regions $56A_1$, $56B_1$, $56C_1$, and $56D_1$, respectively, shown in FIG. 5.

Figure 7:
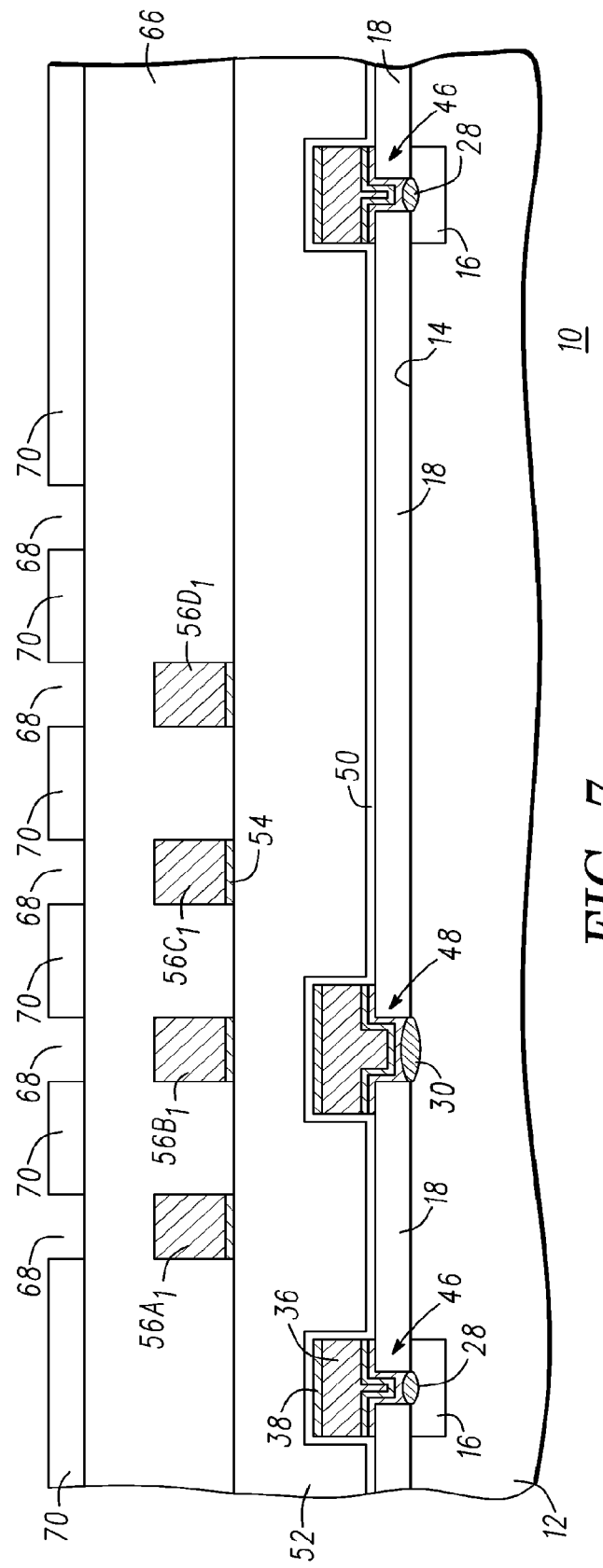
FIG. 7 is a cross-sectional view of the semiconductor component of FIG. 6 at a later stage of manufacture.

Referring now to FIG. 7, a layer of dielectric material 66 having a thickness ranging from about 2 μm to about 20 μm is formed on portions 56A, 56B, 56C, and 56D of coil 64 and on the exposed portions of TEOS layer 52. By way of example, layer 66 is a TEOS layer. A layer of photoresist is formed on dielectric layer 66 and patterned to have openings 68 that expose portions of dielectric layer 66. The remaining portions of the photoresist layer serve as a masking structure 70.

Figure 8:
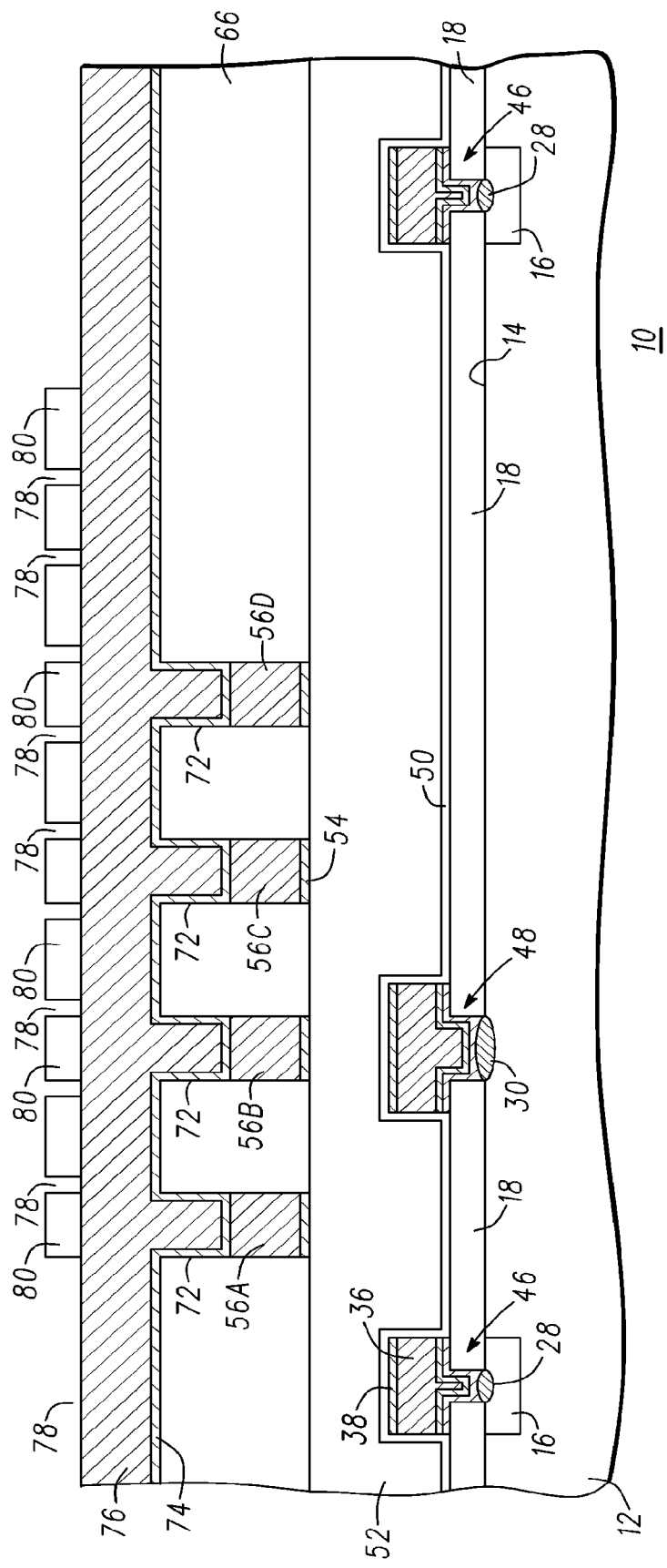
FIG. 8 is a cross-sectional view taken along section line 8-8 of FIG. 11, but at an earlier stage of manufacture.
Figure 9:
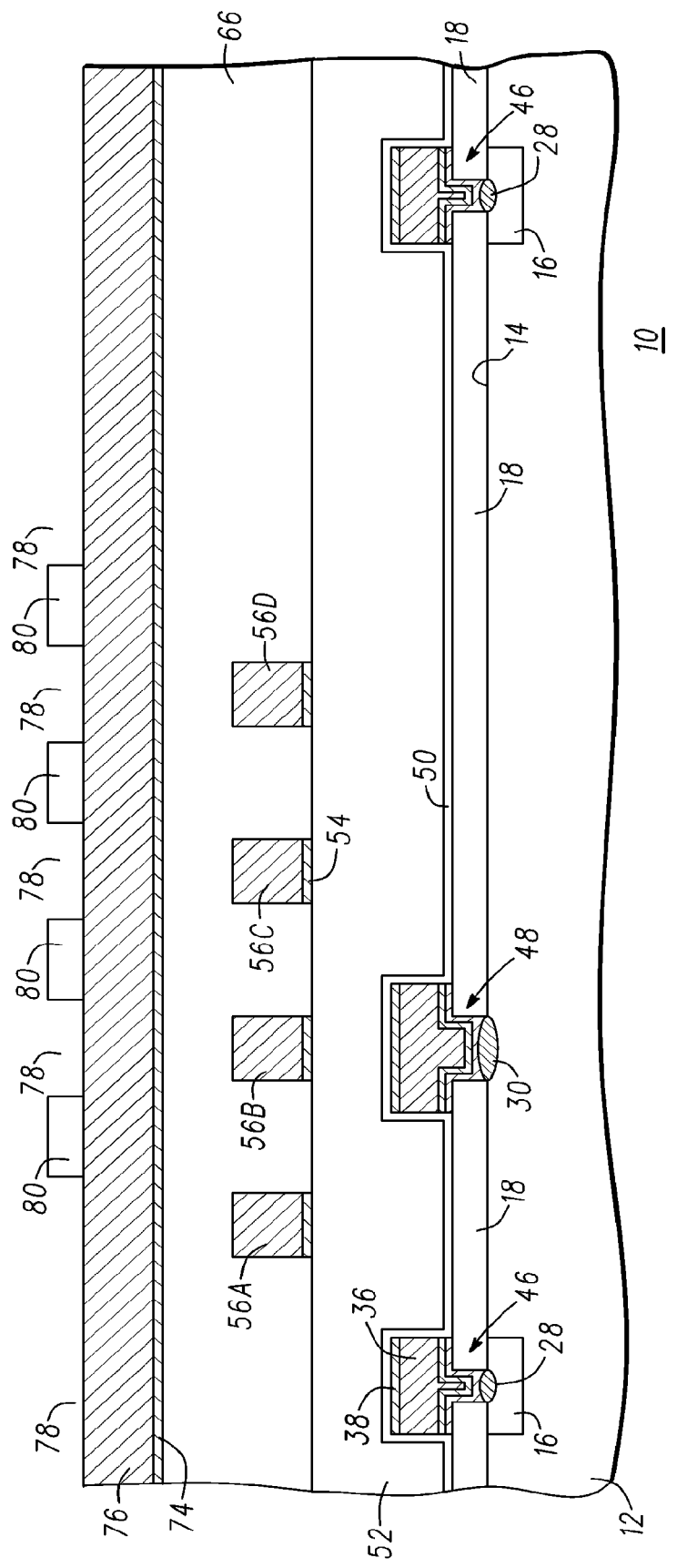
FIG. 9 is a cross-sectional view taken along section line 9-9 of FIG. 11, but at an earlier stage of manufacture.

Referring now to FIGS. 8 and 9, the exposed portions of dielectric layer 66 are anisotropically etched using, for example, a reactive ion etch and an etch chemistry that preferentially etches the dielectric material of dielectric layer 66. It should be noted that FIGS. 8 and 9 are cross-sectional views taken along section lines 8-8 and 9-9, respectively, of FIG. 11, but at an earlier stage of manufacture. The etch forms openings 72 in dielectric layer 66. Openings 72 expose portions 56A-56D of coil 64. Masking structure 70 is removed. A barrier layer 74 is formed along the sidewalls of openings 72 and over the exposed portions of dielectric layer 66. By way of example, barrier layer 74 is titanium nitride. The material for barrier layer 74 is not a limitation of the present invention. A layer of electrically conductive material 76 is formed over barrier layer 74. Suitable materials for electrically conductive material 76 include copper, gold, silver, aluminum, an aluminum alloy, or the like.

A layer of photoresist is formed on electrically conductive layer 76 and patterned to have openings 78 that expose portions of electrically conductive layer 76. The remaining portions of the photoresist layer serve as a masking structure 80.

Figure 10:
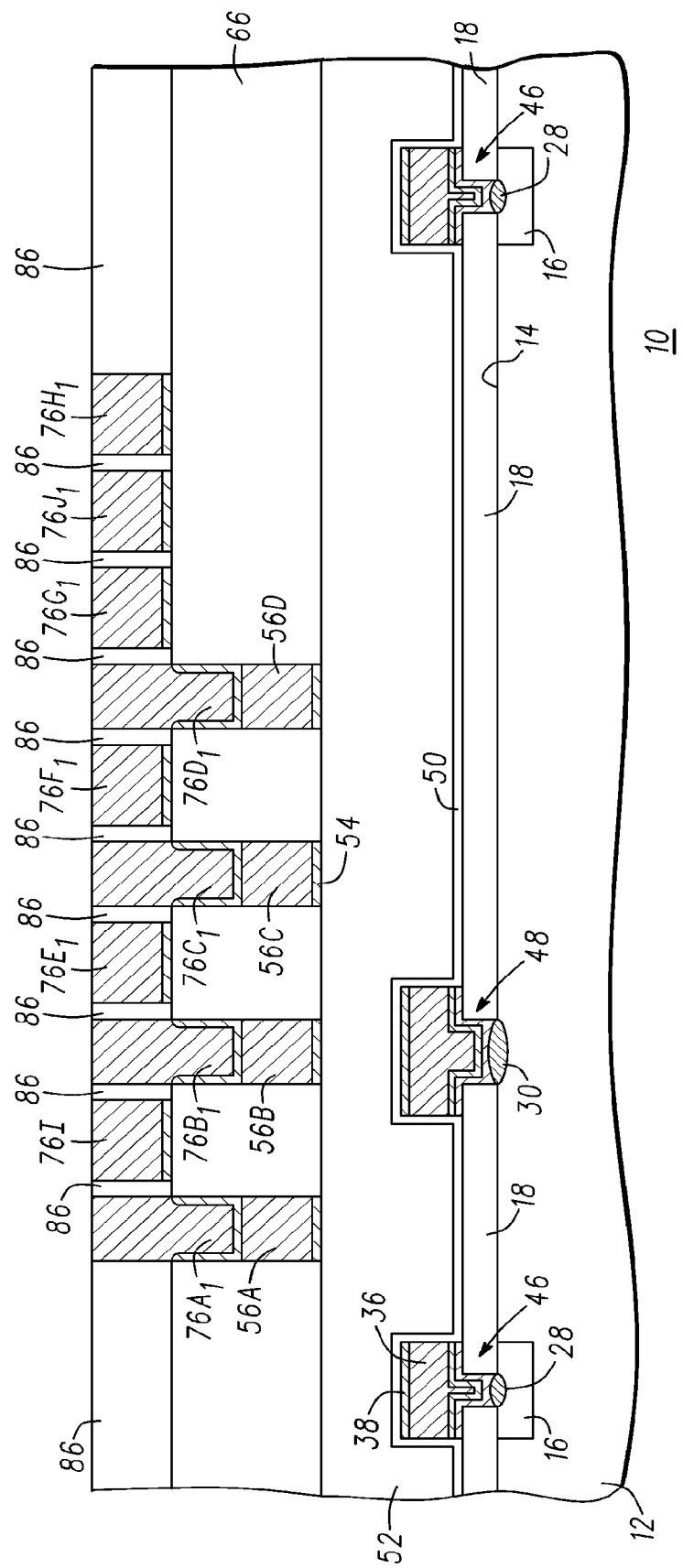
FIG. 10 is a cross-sectional view of the semiconductor component of FIG. 8 at a later stage of manufacture.

Referring now to FIG. 10, the exposed portions of electrically conductive layer 76 are anisotropically etched using, for example, a reactive ion etch and an etch chemistry that preferentially etches the material of electrically conductive layer 76, e.g., copper when layer 76 is copper. FIG. 10 is a cross-sectional view of semiconductor component 10 of FIG. 8 at a later stage. Thus, FIG. 10 is a cross-sectional view taken along section line 8-8 of FIG. 11. The etch stops on dielectric layer 66. After the etch, portions $76A_1$, $76B_1$, $76C_1$, $76D_1$, $76E_1$, $76F_1$, $76G_1$, $76H_1$, $76A_2$, $76B_2$, $76C_2$, $76D_2$, $76E_2$, $76F_2$, $76G_2$, $76H_2$, 76I, and 76J of electrically conductive layer 76 remain. Portions $76A_2$, $76B_2$, $76C_2$, $76D_2$, $76E_2$, $76F_2$, $76G_2$, $76H_2$ are illustrated with reference to FIG. 11. Portions $76A_1$, $76B_1$, $76C_1$, and $76D_1$ are over portions $56A_1$, $56B_1$, $56C_1$, and $56D_1$, respectively, and serve as contacts to coil 64. Portions $76E_1$, $76F_1$, $76G_1$, and $76H_1$ form a portion 82 of a coil or inductor 84. Masking structure 80 is removed. Portions 76I and $76H_1$ serve as terminals for coil 84 and portions $76A_1$ and 76J serve as terminals for coil 64. A layer of dielectric material 86 is formed on the exposed portions of dielectric material 66.

Figure 11:
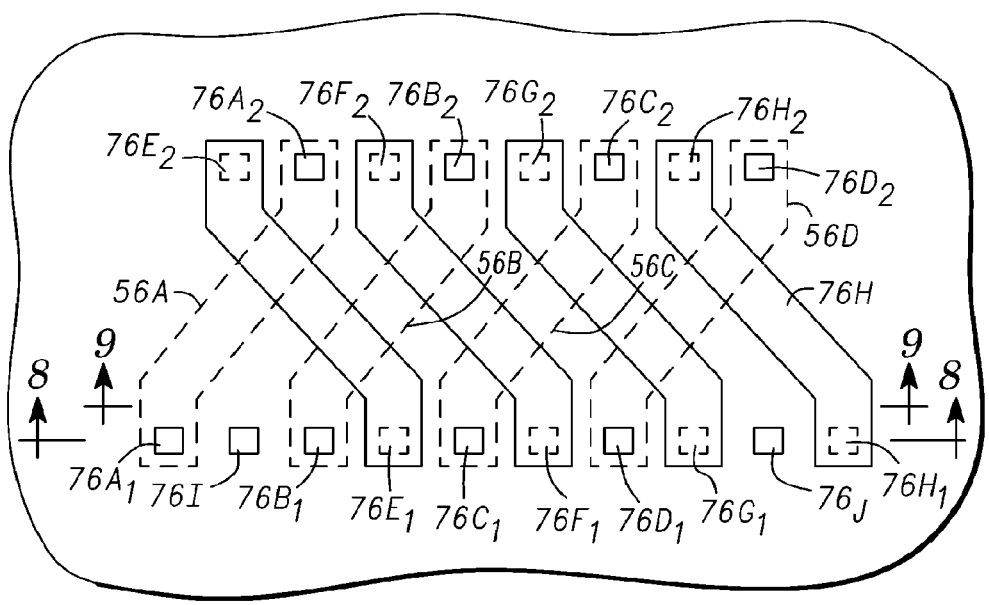
FIG. 11 is a top view of the semiconductor component of FIG. 9 at a later stage of manufacture.

Referring now to FIG. 11, a top view of portions 56A, 56B, 56C, and 56D of coil 64 is illustrated as broken lines and portions 76E, 76F, 76G, and 76H of coil 84 are shown as solid lines. FIG. 11 further illustrates contacts $76A_1$, $76B_1$, $76C_1$, and $76D_1$, and terminals 76I and 76J that are illustrated in FIG. 10. In addition, FIG. 11 illustrates contacts $76A_2$, $76B_2$, $76C_2$, and $76D_2$ that are formed along with contacts $76A_1$, $76B_1$, $76C_1$, and $76D_1$. It should be noted that contacts $76A_1$, $76B_1$, $76C_1$, $76D_1$ contact one end of coil portions 56A, 56B, 56C, and 56D and interconnects $76A_2$, $76B_2$, $76C_2$, $76D_2$ contact an opposing end of coil portions 56A, 56B, 56C, and 56D, respectively. Similarly, FIG. 11 illustrates contact portions $76E_1$, $76F_1$, $76G_1$, and $76H_1$ and contact portions $76E_2$, $76F_2$, $76G_2$, and $76H_2$ that serve as contact portions of an opposing ends of coil portions 76E, 76F, 76G, and 76H, respectively.

Referring now to FIG. 12, terminal 76I is coupled to contact $76E_2$ via a bonding wire 90, contact $76E_1$ is coupled to contact $76F_2$ via a bonding wire 92, contact $76F_1$ is coupled to contact $76G_2$ via a bonding wire 94, contact $76G_1$ is coupled to contact $76H_2$ via a bonding wire 96. Contact $76B_1$ is coupled to contact $76A_2$ via a bonding wire 100, contact $76C_1$ is coupled to contact $76B_2$ via a bonding wire 102, contact $76D_1$ is coupled to contact $76C_2$ via a bonding wire 104, and terminal 76J is coupled to contact $76D_2$ via a bonding wire 106. Contact $76A_1$ and terminal 76J serve as input and output terminals of a coil 64 and terminal 76I and contact $76H_1$ serve as input and output terminals of a coil 84. Coils 64 and 84 cooperate to form a common mode choke.

Figure 13:
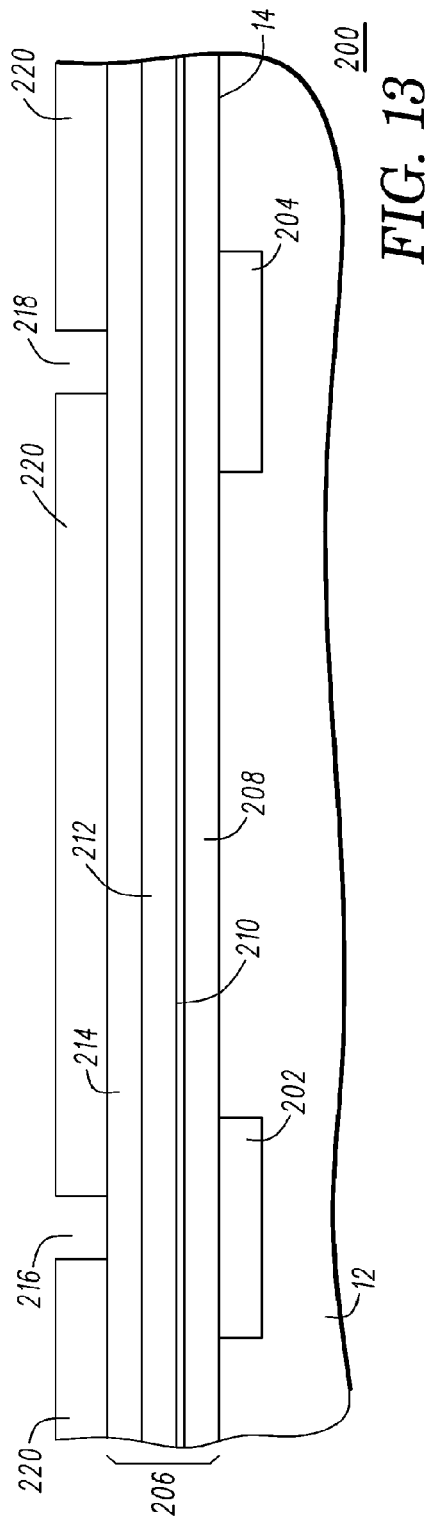
FIG. 13 is a cross-sectional view of a semiconductor component of FIG. 17 taken along section line 18-18 of FIG. 17, but at an earlier stage of manufacture.

FIG. 13 is a cross-sectional view of a semiconductor component 200 taken along section line 18-18 of FIG. 17, but at an earlier stage of manufacture, in accordance with another embodiment. What is shown in FIG. 13 is semiconductor material 12 having major surface 14. Semiconductor material 12 has been described with reference to FIG. 1. Transient voltage suppression structures 202 and 204 may be formed in or from semiconductor material 12. In addition, active devices (not shown) such as, for example, transistors, diodes, or the like and passive devices (not shown) such as, for example, resistors, capacitors, inductors, or the like may be formed in or from semiconductor material 12. A dielectric structure 206 is formed over semiconductor material 12. By way of example, dielectric structure 206 is a multi-layer dielectric structure comprising: a screen oxide layer 208 formed over or from semiconductor material 12, a reoxidation layer 210 formed on or from screen oxide layer 208, an undoped silicate glass (USG) layer 212 formed on reoxidation layer 210, and a boro-phospho silicate glass layer 214 formed over USG layer 212. It should be understood that the number of layers of insulating material, the thicknesses of the layers of insulating material, and the methods for forming the insulating layers of dielectric structure 206 are not limitations. Thus, dielectric structure 206 may be comprised of one, two, three, or more layers of dielectric material. A layer of photoresist is formed on dielectric layer 214 and patterned to have openings 216 and 218 that expose portions of dielectric layer 214 of dielectric structure 206. The remaining portions of the photoresist layer serve as a masking structure 220.

Figure 14:
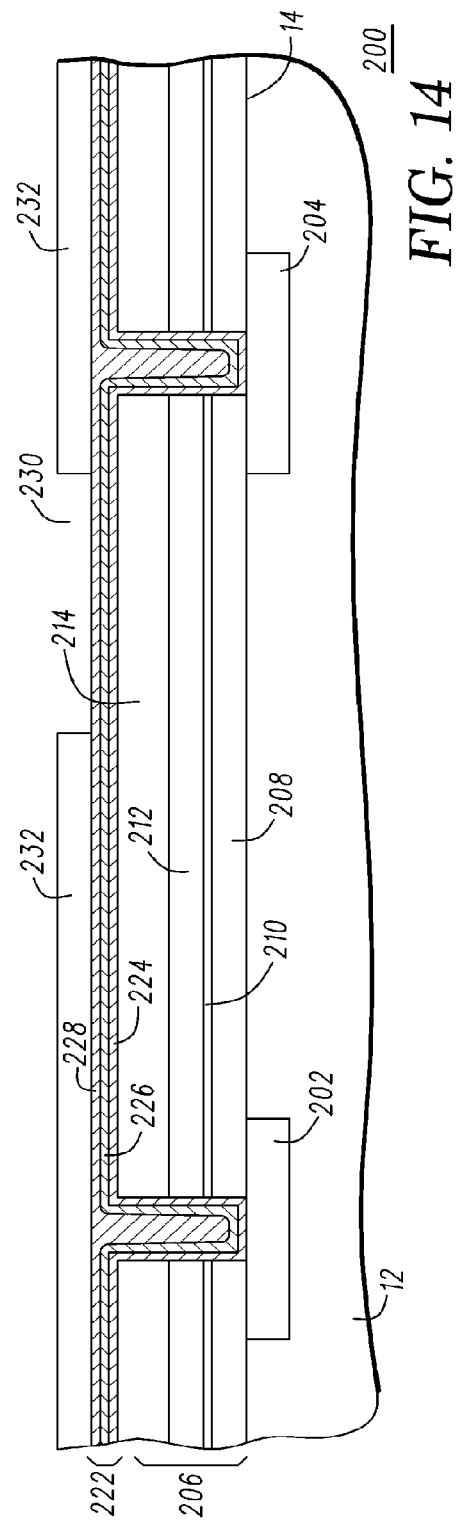
FIG. 14 is a cross-sectional view of the semiconductor component of FIG. 13 at a later stage of manufacture.

Referring now to FIG. 14, the portions of dielectric structure 206 exposed by openings 216 and 218 are removed using, for example, an anisotropic reactive ion etch to expose portions of transient voltage suppression devices 202 and 204. An electrically conductive barrier structure 222 having a thickness ranging from about 1,000 Å to about 10,000 Å is formed along the exposed portions of dielectric layers 208-214 and on the exposed portions of semiconductor material 12 in which transient voltage suppression devices 202 and 204 are formed. By way of example, electrically conductive barrier structure 222 is comprised of a layer of titanium nitride 224 formed on the exposed portions of dielectric layers 208-214 and semiconductor material 12 and a layer of titanium 226 formed on titanium nitride layer 224. Suitable techniques for forming titanium nitride layer 224 and titanium layer 226 include sputtering, Chemical Vapor Deposition (CVD), Plasma Enhanced Chemical Vapor Deposition (PECVD, evaporation, or the like. The material for layers 224 and 226 are not limited to being titanium nitride and titanium, respectively. Other suitable materials for layer 224 include tantalum nitride, tungsten nitride, or the like, and other suitable materials for layer 226 include tantalum, a combination of tantalum and tantalum nitride, tungsten, refractory metal compounds such as, for example, refractory metal nitrides, refractory metal carbides, refractory metal borides, or the like.

A layer of electrically conductive material 228 such as for example, aluminum is formed on titanium nitride layer 226. Techniques for forming aluminum layer 228 include sputtering, evaporation, plasma deposition, or the like. Electrically conductive layer 228 is not limited to being aluminum. Other suitable electrically conductive materials for layer 228 include copper, nickel, or the like. A layer of photoresist is formed on aluminum layer 228 and patterned to have one or more openings 230 that expose one or more portions of aluminum layer 228. The remaining portions of the photoresist layer serve as a masking structure 232.

Referring now to FIG. 15, the exposed portion or portions of aluminum layer 228 and the portions of titanium nitride layer 226 and titanium layer 224 that are below the exposed portion or portions of aluminum layer 228 are anisotropically etched using, for example, a reactive ion etch and etch chemistries suitable for etching aluminum, titanium, and titanium nitride. It should be noted that FIG. 15 is a cross-sectional view of semiconductor component 200 taken along section line 18-18 of FIG. 17, but at an earlier stage of manufacture. Etching the exposed portion of aluminum layer 228 and the portions of titanium nitride layer 226 and titanium layer 224 that are below the exposed portion of aluminum layer 228 exposes a portion of dielectric structure 206. Thus, the etch forms a contact structure 234 that electrically contacts transient voltage suppression device 202 and a contact structure 236 that electrically contacts transient voltage suppression device 204. Masking structure 232 is removed.

Still referring to FIG. 15, a passivation layer 238 is formed on or over electrical contact structures 234 and 236 and on the exposed portion of dielectric structure 206. By way of example, passivation layer 238 is silicon nitride ($Si_3N_4$). Other suitable materials for passivation layer 238 include silicon dioxide, or the like. A passivation layer 240 having a thickness ranging from about 2 µm to about 20 µm is formed on passivation layer 238. By way of example, passivation layer 240 is polyimide. A layer of photoresist (not shown) is formed on passivation layer 240 and patterned to have openings that expose portions of passivation layer 240 that are over transient voltage suppression devices 202 and 204. The remaining portions of the photoresist layer serve as a masking structure.

The exposed portions of passivation layer 240 and the portions of passivation layer 238 that are between the exposed portions of passivation layer 240 and transient voltage suppression devices 202 and 204 are anisotropically etched to expose portions of contact structures 234 and 236. The masking structure is removed. An electrically conductive barrier structure 241 having a thickness ranging from about 0.1 µm to about 1 µm is formed along the exposed portions of passivation layers 226 and 228 and on the exposed portions of contact structures 234 and 236. By way of example, the electrically conductive barrier structure is comprised of a layer of titanium nitride 242 formed on the exposed portions of passivation layers 238 and 240 and the exposed portions of contact structures 234 and 236 and a layer of titanium 244 is formed on titanium nitride layer 242. Suitable techniques for forming titanium nitride layer 242 and titanium layer 244 include sputtering, Chemical Vapor Deposition (CVD), Plasma Enhanced Chemical Vapor Deposition (PECVD), evaporation, or the like. The material for layers 242 and 244 are not limited to being titanium nitride and titanium, respectively. Other suitable materials for layer 242 include tantalum nitride, tungsten nitride, or the like, and other suitable materials for layer 244 include tantalum, a combination of tantalum and tantalum nitride, tungsten, refractory metal compounds such as, for example, refractory metal nitrides, refractory metal carbides, refractory metal borides, or the like. A layer of photoresist is formed on titanium layer 244 and patterned to have openings 246A, 246B, 246C, 246D, and 247 that expose portions of titanium layer 244. The remaining portions of the photoresist layer serve as a masking structure 248.

FIG. 16 is a cross-sectional view taken along section line 19-19 of FIG. 17 but at an earlier stage of manufacture. What is shown in FIG. 16 is a portion of semiconductor component 200 in which contact structures are absent. More particularly, FIG. 16 illustrates dielectric structure 206, passivation layers 238 and 240, barrier structure 241, openings 246A-246D, and portions of masking structure 248. It should be noted that FIGS. 15 and 16 represent the same stage of the manufacture of semiconductor component 200, but at different locations.

Referring now to FIG. 17, an electrically conductive material is formed on the exposed portions of titanium nitride layer 244 in openings 246A, 246B, 246C, 246D, and 247 to form electrically conductive strips 252A, 252B, 252C, and 252D, respectively. It should be noted that FIG. 17 is a top view of semiconductor component 200 that further illustrates the regions through which section lines 18-18 and 19-19 are taken and that reference characters "A," "B," "C," and "D" have been appended to reference character 246 to distinguish in which openings the electrically conductive material is formed. Electrically conductive strip 252A has ends $252A_1$ and $252A_2$ and a body $252A_3$, electrically conductive strip 252B has ends $252B_1$ and $252B_2$ and a body $252B_3$, electrically conductive strip 252C has ends $252C_1$ and $252C_2$ and a body $252C_3$, and electrically conductive strip 252D has ends $252D_1$ and $252D_2$ and a body $252D_3$. By way of example, the electrically conductive material is copper formed using an electroplating technique. The technique for forming electrically conductive strips 252A, 252B, 252C, and 252D, the electrically conductive material of electrically conductive strips 252A, 252B, 252C, and 252D, and the number of electrically conductive strips that are formed are not limitations. Other suitable techniques for forming electrically conductive strips 252A, 252B, 252C, and 252D include sputtering, evaporation, wet-etching, dry-etching, or the like and other suitable materials for electrically conductive strips 252A, 252B, 252C, and 252D include gold, aluminum, silver, or the like. It should be noted that electrically conductive strips 252A, 252B, 252C, and 252D serve as portions or elements of a coil or inductor.

FIG. 18 is a cross-sectional view of semiconductor component 200 taken along section line 18-18 of FIG. 17. FIG. 18 further illustrates ends $252A_1$, $252B_1$, $252C_1$, and $252D_1$, and a contact extension 253 formed on titanium layer 244.

FIG. 19 is a cross-sectional view of semiconductor component 200 taken along section line 19-19 of FIG. 17. What is shown in FIG. 19 are portions of dielectric structure 206, passivation layers 238 and 240, barrier structure 241, and electrically conductive strips 252A, 252B, 252C, and 252D, respectively. It should be noted that FIGS. 18 and 19 represent the same stage of the manufacture of semiconductor component 200, but at different locations.

Figure 20:
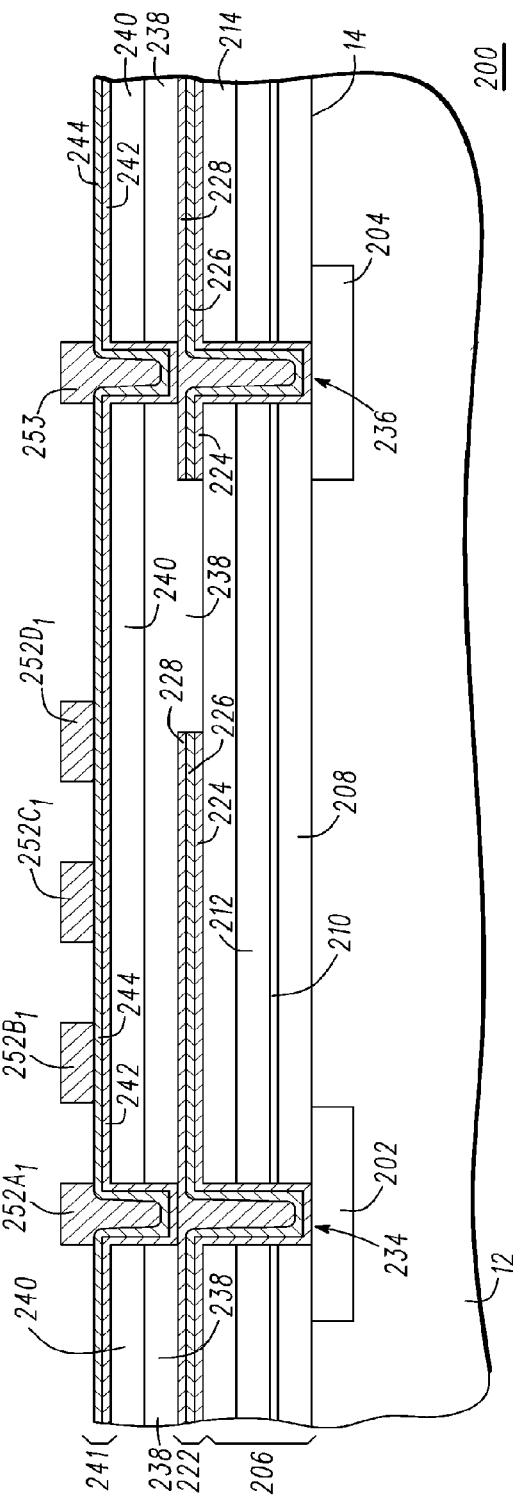
FIG. 20 is a cross-sectional view of the semiconductor component of FIG. 18 at a later stage of manufacture.
Figure 21:
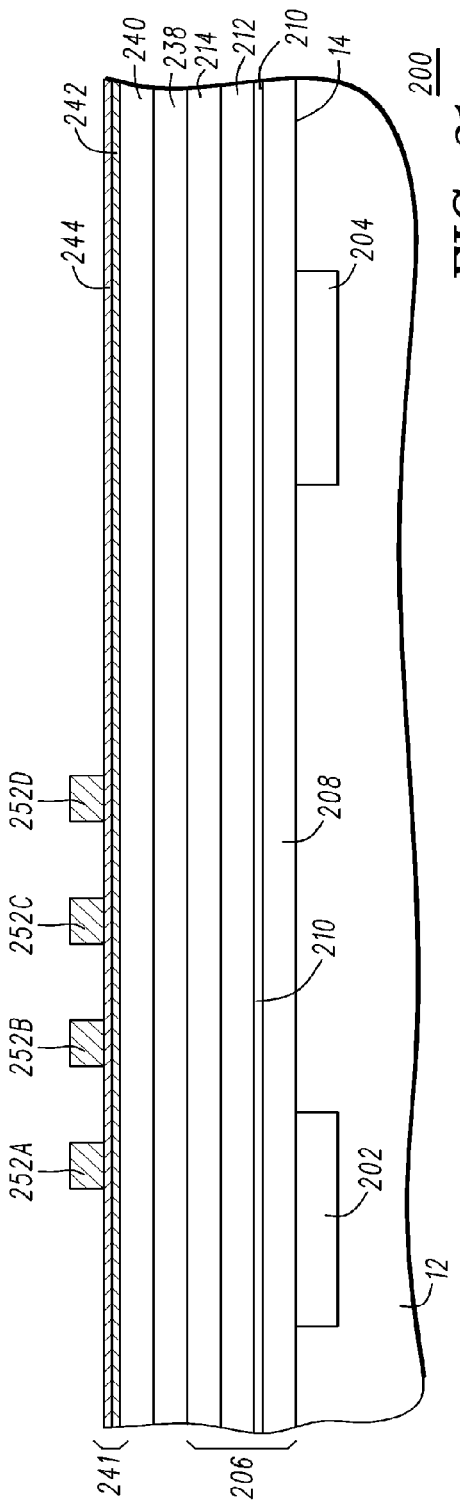
FIG. 21 is a cross-sectional view of the semiconductor component of FIG. 19 at a later stage of manufacture.

FIGS. 20 and 21 are cross-sectional views of semiconductor component 200 of FIGS. 18 and 19, respectively, taken at a subsequent step. What is shown in FIGS. 20 and 21 is semiconductor component 200 after the removal of masking structure 248. It should be noted that the top view of semiconductor component 200 at the processing step illustrated by FIGS. 20 and 21 looks similar to that of FIG. 17. It should be noted that FIGS. 20 and 21 represent the same stage of the manufacture of semiconductor component 200, but at different locations.

Figure 22:
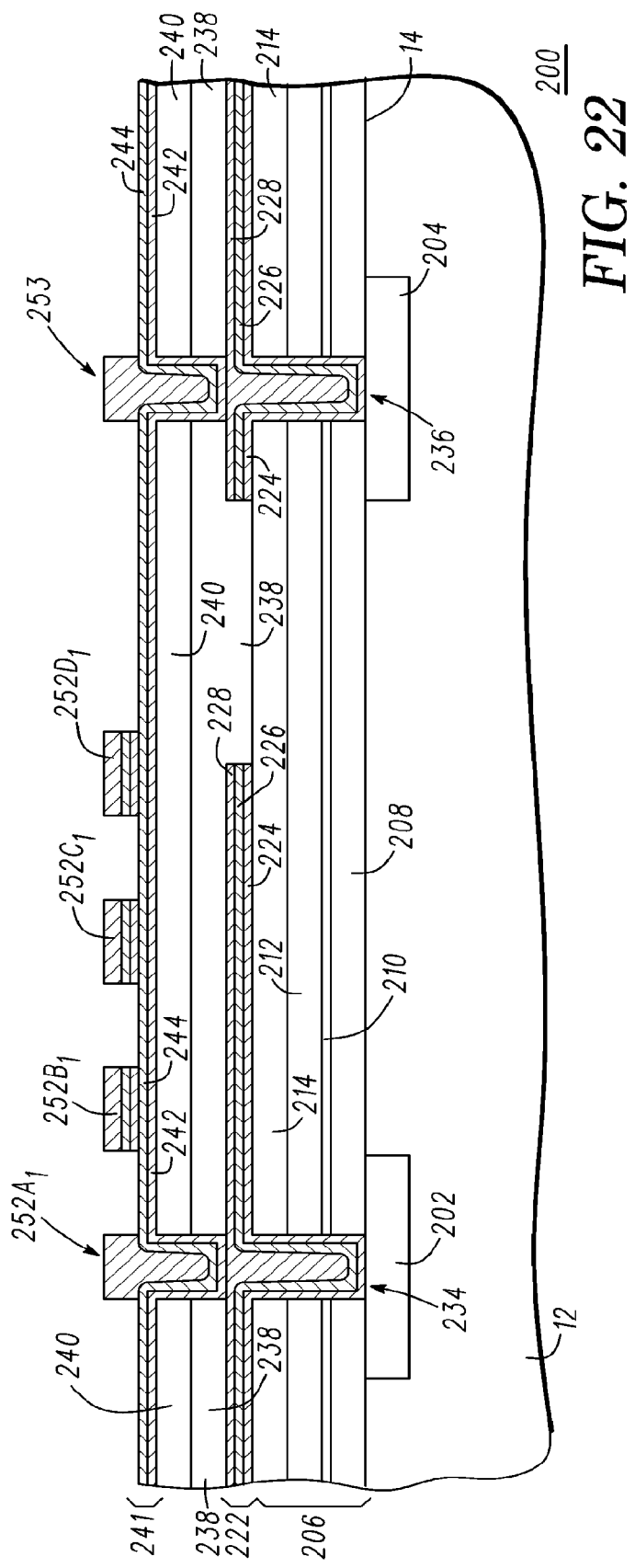
FIG. 22 is a cross-sectional view of the semiconductor component of FIG. 20 at a later stage of manufacture.

FIG. 22 is a cross-sectional view of semiconductor component 200 of FIG. 20 at a later stage of manufacture. What is shown in FIG. 22 is semiconductor component 200 after the removal of the portions of electrically conductive layers 244 and 242 that were exposed by the removal of masking structure 248. It should be noted that the top view of semiconductor component 200 at the processing step illustrated by FIG. 22 looks similar to that of FIG. 17.

Figure 23:
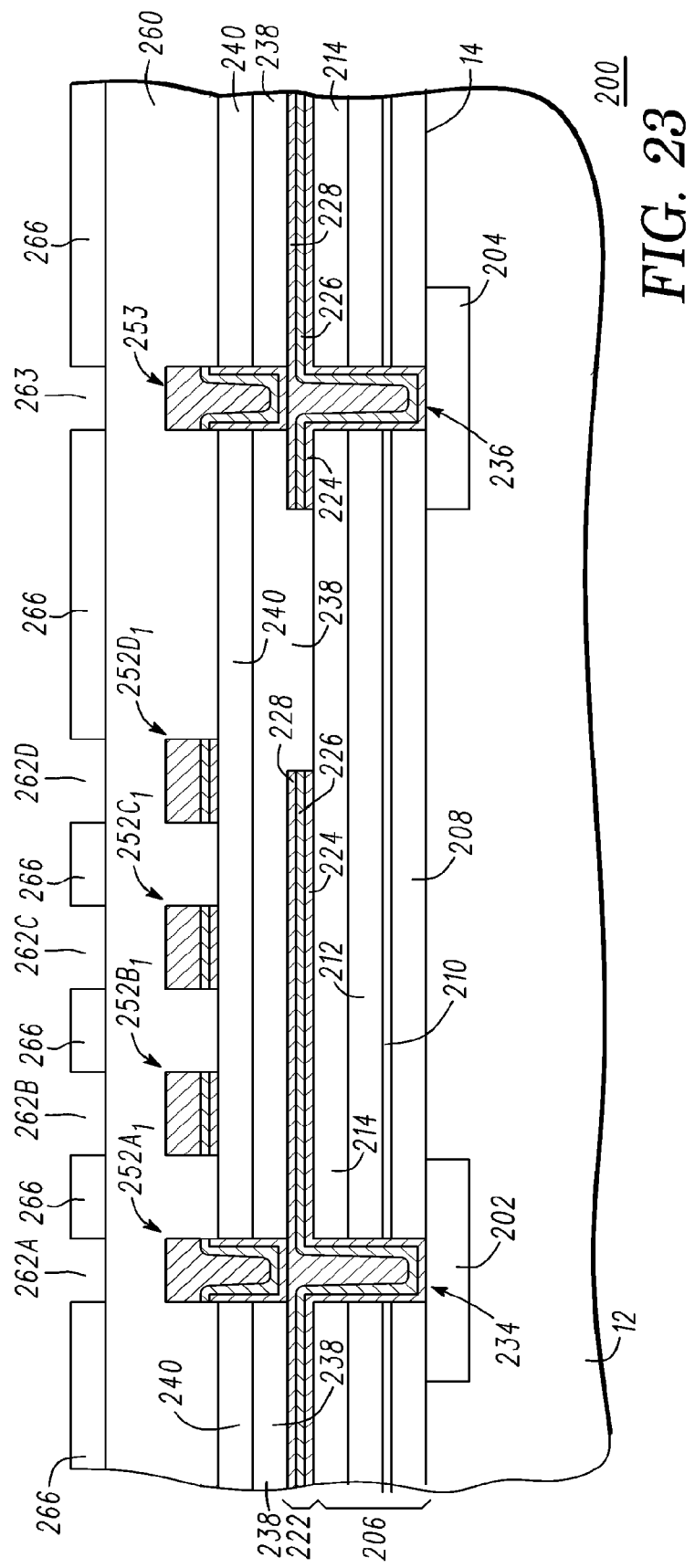
FIG. 23 is a cross-sectional view of the semiconductor component of FIG. 22 at a later stage of manufacture.
Figure 24:
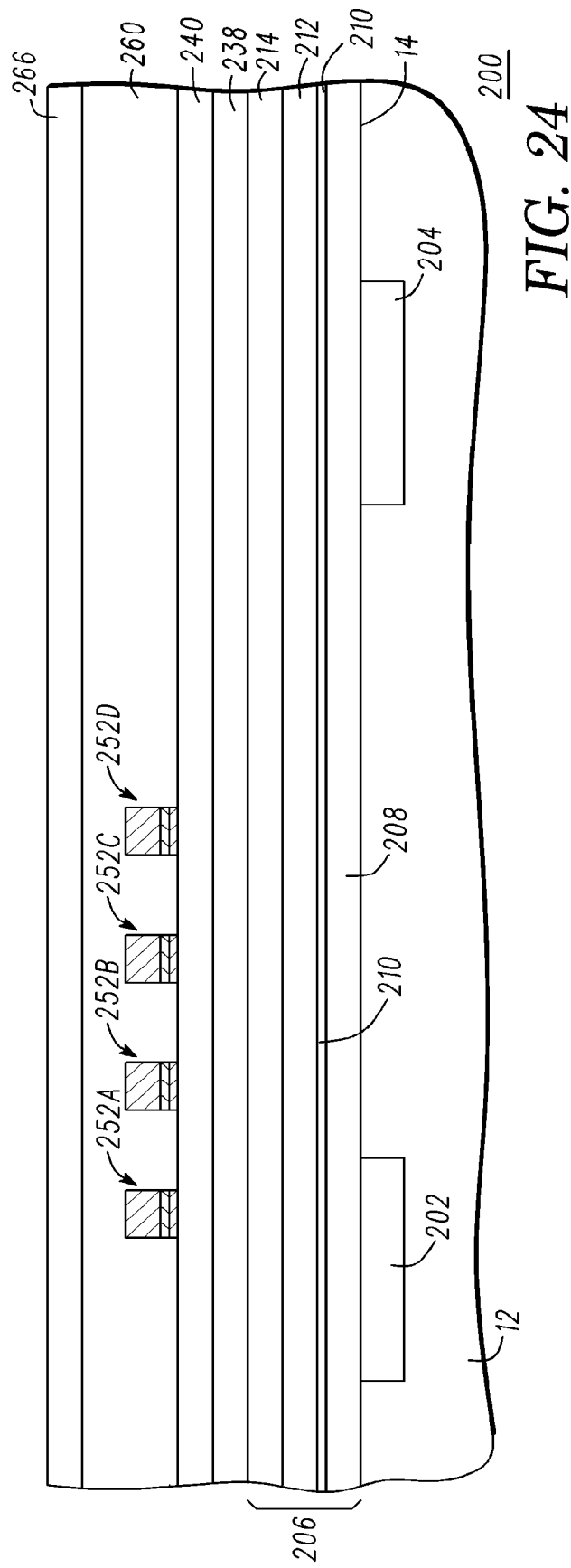
FIG. 24 is a cross-sectional view of the semiconductor component of FIG. 22 at a different location and at a later stage of manufacture.

Referring now to FIGS. 23 and 24, a passivation layer 260 is formed on or over electrically conductive strips 252A, 252B, 252C, and 252D and on the exposed portions of passivation layer 240. It should be noted that FIGS. 23 and 24 represent the same stage of the manufacture of semiconductor component 200, but at different locations. By way of example, passivation layer 260 is polyimide. Other suitable materials for passivation layer 260 include silicon dioxide, silicon nitride, or the like. A layer of photoresist (not shown) is formed on polyimide layer 260 and patterned to have openings 262A, 262B, 262C, and 262D that expose portions of polyimide layer 260 that are over end portions $252A_1$, $252B_1$, $252C_1$, and $252D_1$ and over end portions $252A_2$, $252B_2$, $252C_2$, and $252D_2$, respectively, and an opening 263 over contact extension 253. The remaining portions of the photoresist layer serve as a masking structure 266.

Figure 25:
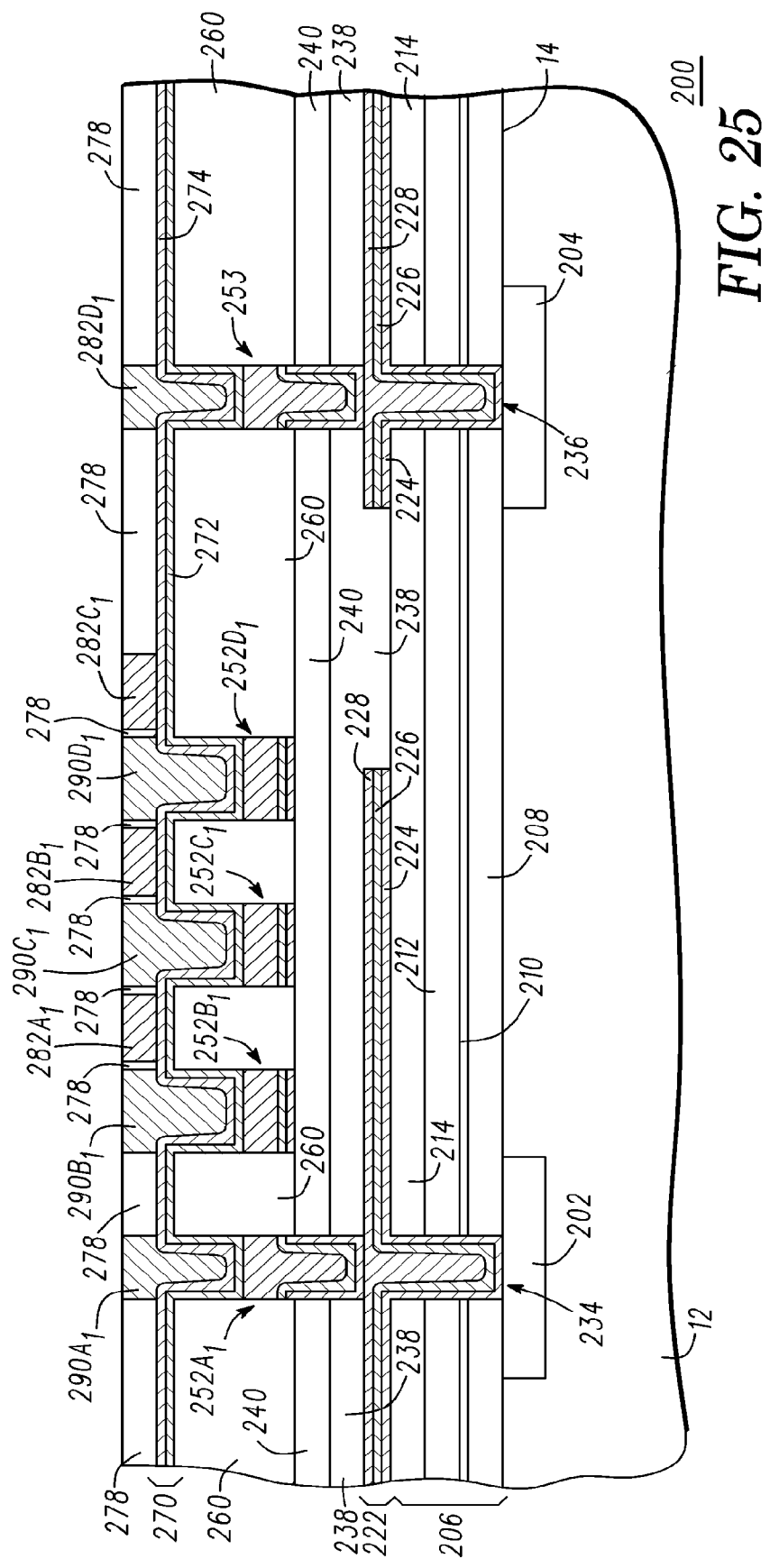
FIG. 25 is a cross-sectional view of the semiconductor component of FIG. 23 at a later stage of manufacture.
Figure 26:
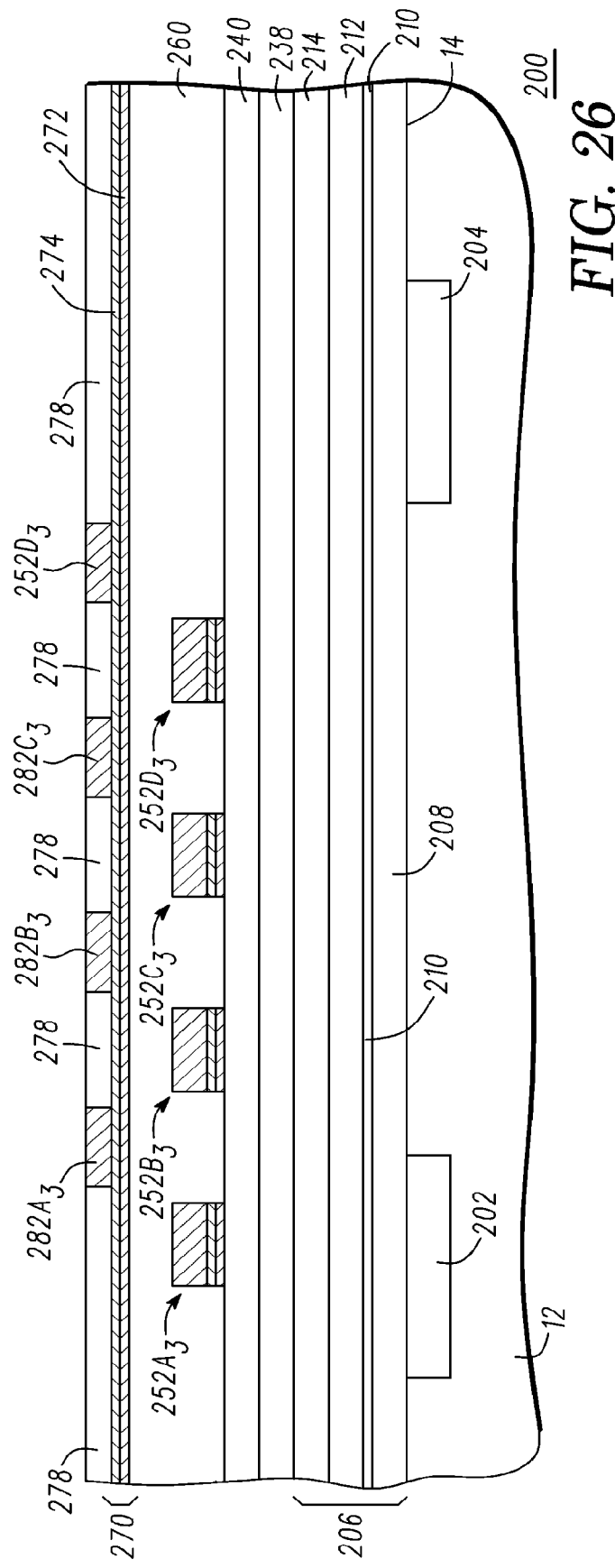
FIG. 26 is a cross-sectional view of the semiconductor component of FIG. 24 at a different location and at a later stage of manufacture.

Referring now to FIGS. 25 and 26, the exposed portions of polyimide layer 260 are anisotropically etched to expose end portions $252A_1$, $252B_1$, $252C_1$, and $252D_1$ of electrically conductive strips 252A, 252B, 252C, and 252D, respectively, end portions $252A_2$, $252B_2$, $252C_2$, and $252D_2$ (not shown in FIGS. 25 and 26) of electrically conductive strips 252A, 252B, 252C, and 252D, respectively, and contact extension 253. The masking structure is removed. An electrically conductive barrier structure 270 having a thickness ranging from about 0.1 µm to about 1 µm is formed along the exposed portions of passivation layer 260 and on end portions $252A_1$, $252B_1$, $252C_1$, and $252D_1$ and end portions $252A_2$, $252B_2$, $252C_2$, and $252D_2$ of electrically conductive strips 252A, 252B, 252C, and 252D, respectively, and on contact extension 253. By way of example, electrically conductive barrier structure 270 is comprised of a layer of titanium nitride 272 and a layer of titanium 274, where the titanium nitride layer is formed on the exposed portions of passivation layer 260, the exposed portions of end portions $252A_1$, $252B_1$, $252C_1$, and $252D_1$ and $252A_2$, $252B_2$, $252C_2$, and $252D_2$ of electrically conductive strips 252A, 252B, 252C, and 252D, respectively, and on contact extension 253. Titanium layer 274 is formed on titanium nitride layer 272. Suitable techniques for forming titanium nitride layer 272 and titanium layer 274 include sputtering, Chemical Vapor Deposition (CVD), Plasma Enhanced Chemical Vapor Deposition (PECVD, evaporation, or the like. The material for layers 272 and 274 are not limited to being titanium nitride and titanium, respectively. Other suitable materials for layer 272 include tantalum nitride, tungsten nitride, or the like, and other suitable materials for layer 274 include tantalum, a combination of tantalum and tantalum nitride, tungsten, refractory metal compounds such as, for example, refractory metal nitrides, refractory metal carbides, refractory metal borides, or the like.

A layer of photoresist is formed on titanium layer 274 and patterned to have openings (not shown) that expose portions of barrier layer 270 on end portions $252A_1$, $252B_1$, $252C_1$, $252D_1$, $252A_2$, $252B_2$, $252C_2$, and $252D_2$ of electrically conductive strips 252A, 252B, 252C, and 252D, respectively, and contact extension 253. In addition, openings are formed to expose portions of barrier layer 270 that are on the portions of polyimide layer 260 that are between electrically conductive strips 252A and 252B, the portions of barrier layer 270 that are on the portions of polyimide layer 260 that are between electrically conductive strips 252B and 252C, the portions of barrier layer 270 that are on the portions of polyimide layer 260 that are between electrically conductive strips 252C and 252D, and the portions of barrier layer 270 that are on the portions of polyimide layer 260 that are laterally adjacent to electrically conductive strip 252D. The remaining portions of the photoresist layer serve as a masking structure 278.

Figure 27:
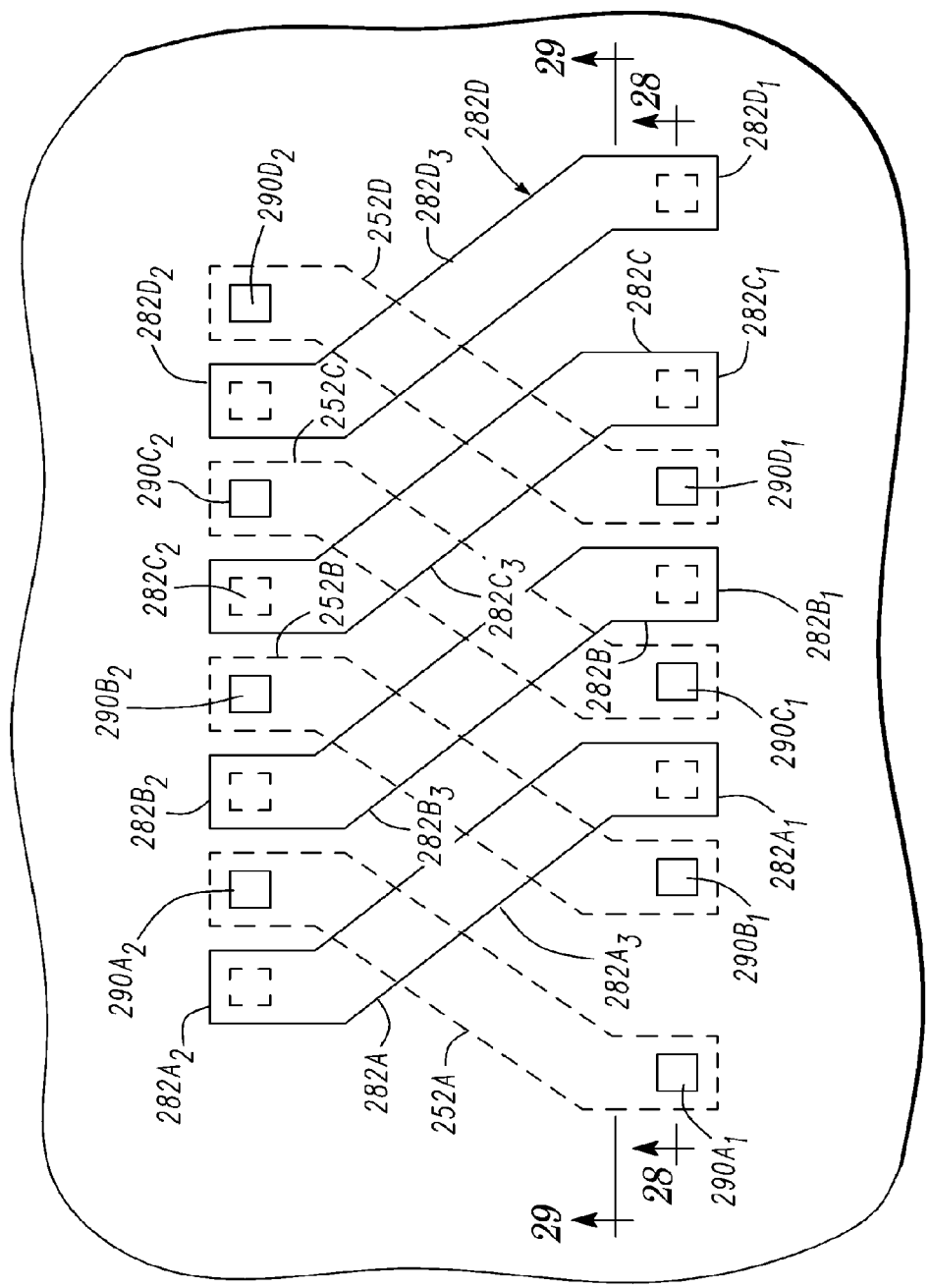
FIG. 27 is a top view of the semiconductor components of FIGS. 25 and 26.

Briefly referring to FIG. 27, an electrically conductive material formed on the exposed portions of titanium nitride layer 274 to form electrically conductive strips 282A, 282B, 282C, and 282D, respectively, is shown. It should be noted that FIG. 27 is a top view of semiconductor component 200 that further illustrates the regions through which section lines 28-28 and 29-29 are taken and that reference characters "A," "B," "C," and "D" have been appended to reference character 282 to distinguish the electrically conductive strips. Electrically conductive strip 282A has ends $282A_1$ and $282A_2$ and a body $282A_3$, electrically conductive strip 282B has ends $282B_1$ and $282B_2$ and a body $282B_3$, electrically conductive strip 282C has ends $282C_1$ and $282C_2$ and a body $282C_3$, and electrically conductive strip 282D has ends $282D_1$ and $282D_2$ and a body $282D_3$. By way of example, the electrically conductive material is copper formed using an electroplating technique. The technique for forming electrically conductive strips 282A, 282B, 282C, and 282D, the electrically conductive material of electrically conductive strips 282A, 282B, 282C, and 282D, and the number of electrically conductive strips that are formed are not limitations. Other suitable materials for electrically conductive strips 282A, 282B, 282C, and 282D include aluminum, gold, silver, or the like. It should be noted that electrically conductive strips 282A, 282B, 282C, and 282D serve as portions or elements of a coil or inductor.

Referring again to FIGS. 25 and 26, cross-sectional views of end portions $282A_1$, $282B_1$, $282C_1$, and $282D_1$, contact portions $290A_1$, $290B_1$, $290C_1$, and $290D_1$, and body portions $282A_3$, $282B_3$, $282C_3$, and $282D_3$ are illustrated. It should be noted that a top view of end portions $282A_1$, $282B_1$, $282C_1$, and $282D_1$, contact portions $290A_1$, $290B_1$, $290C_1$, and $290D_1$, and body portions $282A_3$, $282B_3$, $282C_3$, and $282D_3$ are shown in FIG. 27.

Figure 28:
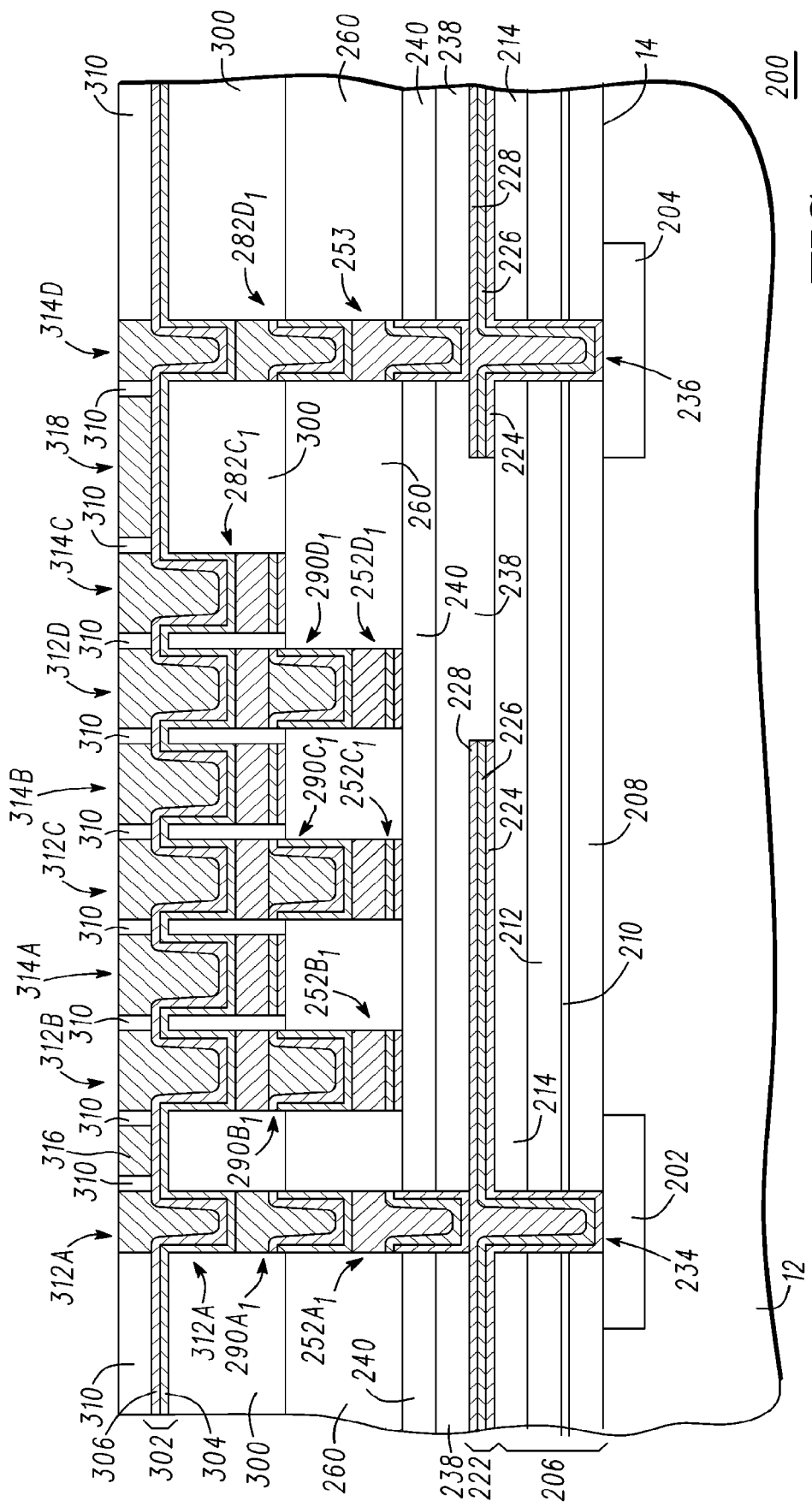
FIG. 28 is a cross-sectional view taken along section line 31-31 of FIG. 30 but at an earlier stage of manufacture.
Figure 29:
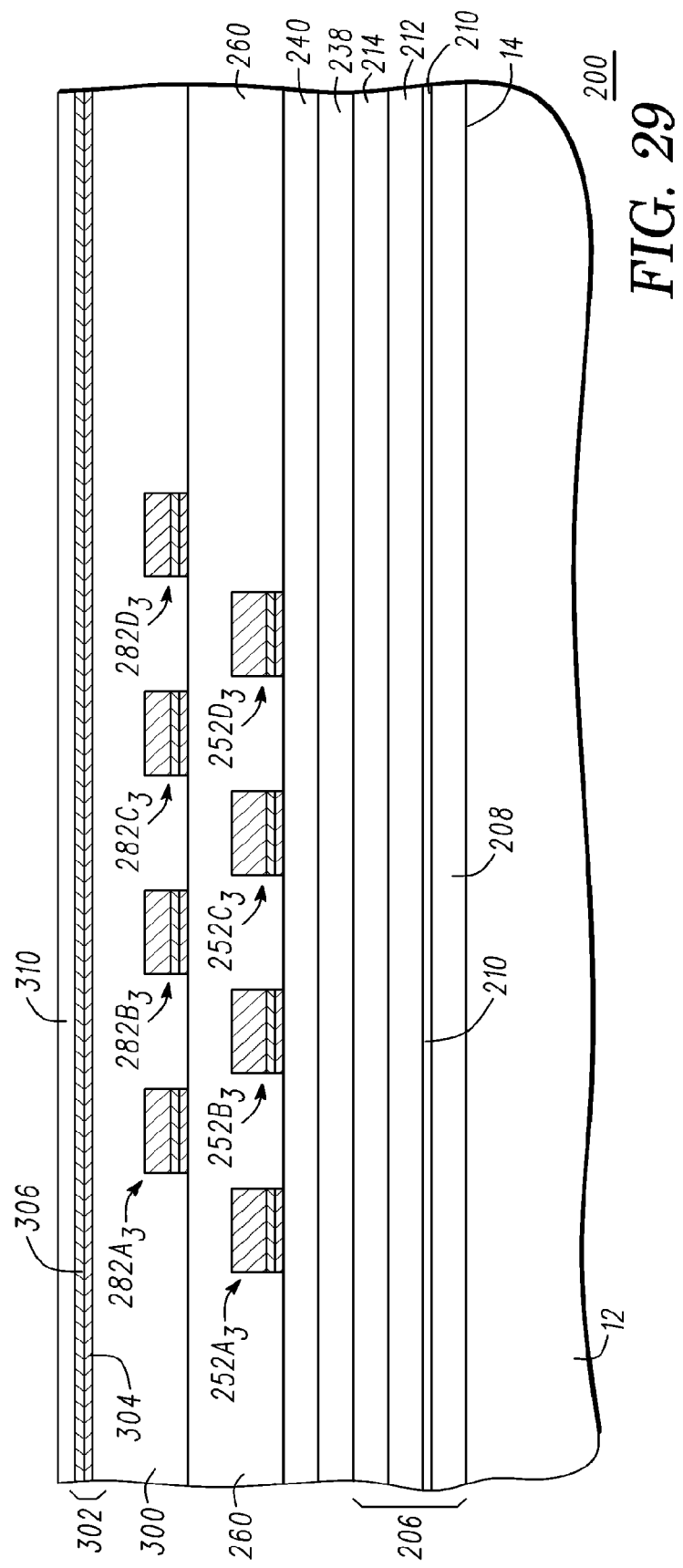
FIG. 29 is a cross-sectional view taken along section line 32-32 of FIG. 30 but at an earlier stage of manufacture.

Referring now to FIGS. 28 and 29, masking structure 278 is removed and a passivation layer 300 is formed on or over contact portions $290A_1$, $290B_1$, $290C_1$, and $290D_1$, electrically conductive strips 282A, 282B, 282C, and 282D, and the exposed portions of polyimide layer 260. By way of example, passivation layer 300 is polyimide. Other suitable materials for passivation layer 300 include silicon dioxide, silicon nitride, or the like. A layer of photoresist (not shown) is formed on polyimide layer 300 and patterned to have openings that expose the portions of polyimide layer 300 that are over contact portions $290A_1$, $290B_1$, $290C_1$, and $290D_1$ and over contact portions $290A_2$, $290B_2$, $290C_2$, and $290D_2$ (shown in FIG. 27) and openings over end portions $282A_1$, $282B_1$, $282C_1$, and $282D_1$ and end portions $282A_2$, $282B_2$, $282C_2$, and $282D_2$ (shown in FIG. 27) of electrically conductive strips 282A, 282B, 282C, and 282D, respectively. The remaining portions of the photoresist layer serve as a masking structure. It should be noted that FIGS. 28 and 29 are cross-sectional views taken along section lines 31-31 and 32-32 of FIG. 30, but at an earlier stage of manufacture.

Still referring to FIGS. 28 and 29, the exposed portions of polyimide layer 300 are anisotropically etched to expose contact portions $290A_1$, $290B_1$, $290C_1$, and $290D_1$, contact portions $290A_2$, $290B_2$, $290C_2$, and $290D_2$, and end portions $282A_1$, $282B_1$, $282C_1$, and $282D_1$ and end portions $282A_2$, $282B_2$, $282C_2$, and $282D_2$ of electrically conductive strips 282A, 282B, 282C, and 282D, respectively. The masking structure is removed. An electrically conductive barrier structure 302 is formed along the exposed portions of passivation layer 300 and on the exposed portions of contact portions $290A_1$, $290B_1$, $290C_1$, and $290D_1$, contact portions $290A_2$, $290B_2$, $290C_2$, and $290D_2$, end portions $282A_1$, $282B_1$, $282C_1$, and $282D_1$, and end portions $282A_2$, $282B_2$, $282C_2$, and $282D_2$. By way of example, the electrically conductive barrier structure is comprised of a layer of titanium nitride 304 and a layer of titanium 306, where titanium nitride layer 304 is formed on passivation layer 300, the exposed portions of contact portions $290A_1$, $290B_1$, $290C_1$, and $290D_1$, contact portions $290A_2$, $290B_2$, $290C_2$, and $290D_2$, end portions $282A_1$, $282B_1$, $282C_1$, and $282D_1$ and end portions $282A_2$, $282B_2$, $282C_2$, and $282D_2$. Titanium layer 306 is formed on titanium nitride layer 304. Suitable techniques for forming titanium nitride layer 304 and titanium layer 306 include sputtering, Chemical Vapor Deposition (CVD), Plasma Enhanced Chemical Vapor Deposition (PECVD), evaporation, or the like. The material for layers 304 and 306 are not limited to being titanium nitride and titanium, respectively. Other suitable materials for layer 304 include tantalum nitride, tungsten nitride, or the like, and other suitable materials for layer 306 include tantalum, a combination of tantalum and tantalum nitride, tungsten, refractory metal compounds such as, for example, refractory metal nitrides, refractory metal carbides, refractory metal borides, or the like.

A layer of photoresist is formed on titanium layer 306 and patterned to have openings (not shown) that expose portions of barrier structure 302 on contact portions $290A_1$, $290B_1$, $290C_1$, $290D_1$, $290A_2$, $290B_2$, $290C_2$, and $290D_2$, and end portions $282A_1$, $282B_1$, $282C_1$, $282D_1$, $282A_2$, $282B_2$, $282C_2$, and $282D_2$ of electrically conductive strips 282A, 282B, 282C, and 282D, respectively. In addition, openings are formed to expose portions of barrier structure 302 that are on the portions of polyimide layer 300 that are between contact portions $290A_1$ and $290B_1$, between contact portions $290B_1$ and $290C_1$, between contact portions $290C_1$ and $290D_1$, and on the portion of polyimide layer laterally adjacent contact portion $290D_1$. The remaining portions of the photoresist layer serve as a masking structure 310.

An electrically conductive material is formed on the exposed portions of barrier structure 302 to form contacts $312A_1$, $312B_1$, $312C_1$, $312D_1$, $314A_1$, $314B_1$, $314C_1$, $314D_1$, and terminals 316 and 318. It should be noted that contact $312A_1$ includes contact portions $290A_1$ and $252A_1$, contact $312B_1$ includes contact portions $290B_1$ and $252B_1$, contact $312C_1$ includes contact portions $290C_1$ and $252C_1$, contact $312D_1$ includes contact portions $290D_1$ and $252D_1$. It should be further understood that contacts $312A_2$, $312B_2$, $312C_2$, $312D_2$, $314A_2$, $314B_2$, $314C_2$, and $314D_2$ shown in FIG. 30 have similar structures to contacts $312A_1$, $312B_1$, $312C_1$, $312D_1$, $314A_1$, $314B_1$, $314C_1$, $314D_1$.

Figure 30:
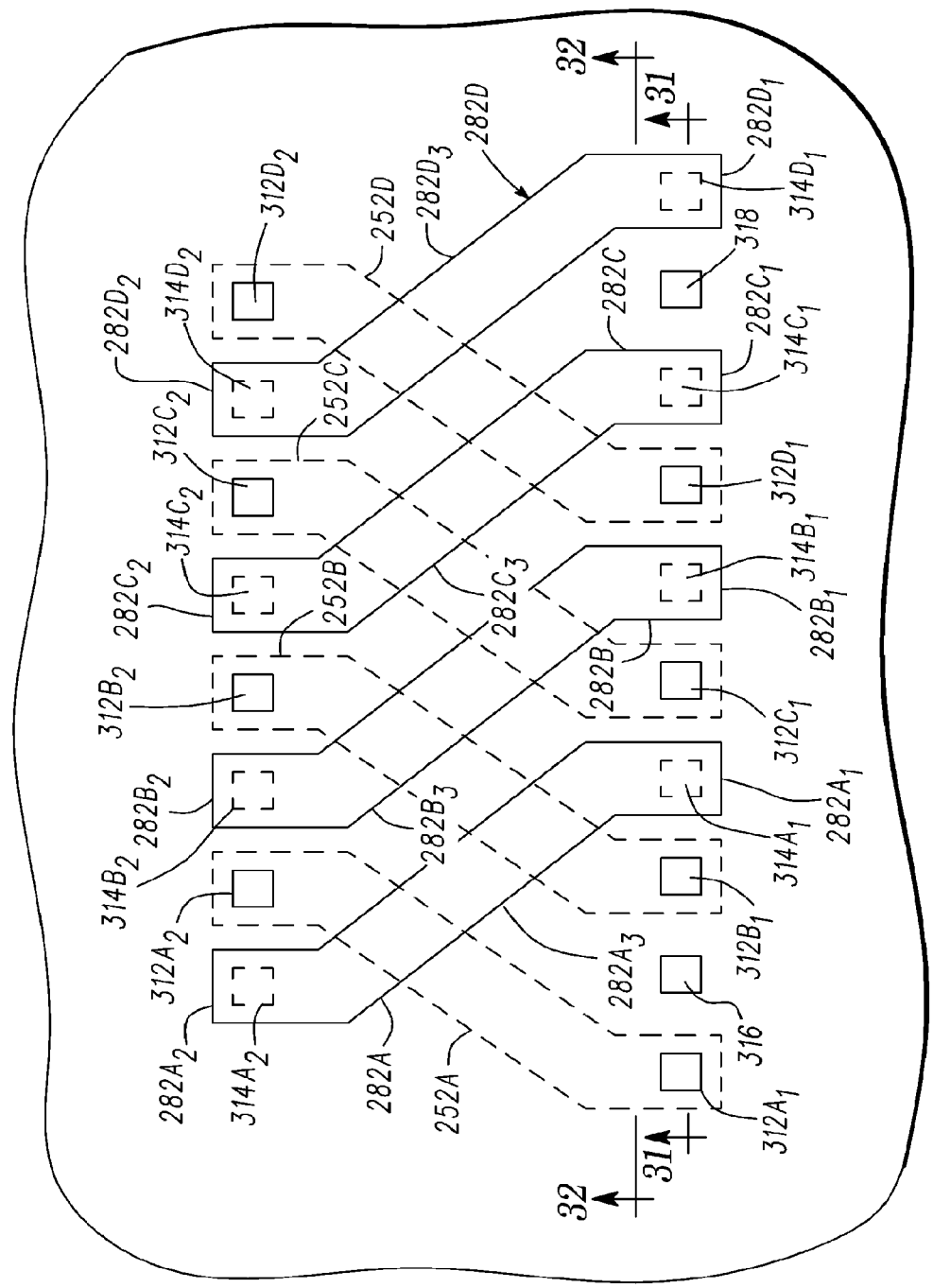
FIG. 30 is a top view of the semiconductor component of FIGS. 28 and 29 at a later stage of manufacture.

FIG. 30 is a top view of semiconductor component 200 after removal of masking structure 310 and the portions of barrier structure 302 exposed by the removal of masking structure 310. What is shown in FIG. 30 are electrically conductive strips 282A, 282B, 282C, and 282D including end portions $282A_1$, $282B_1$, $282C_1$, $282D_1$, $282A_2$, $282B_2$, $282C_2$, and $282D_2$ and body portions $282A_3$, $282B_3$, $282C_3$, $282D_3$, contacts $312A_1$, $312B_1$, $312C_1$, $312D_1$, $312A_2$, $312B_2$, $312C_2$, and $312D_2$, $314A_1$, $314B_1$, $314C_1$, $314D_1$, $314A_2$, $314B_2$, $314C_2$, and $314D_2$, and terminals 316 and 318. In addition, FIG. 30 illustrates electrically conductive strips 252A, 252B, 252C, and 252D as broken lines.

Figure 31:
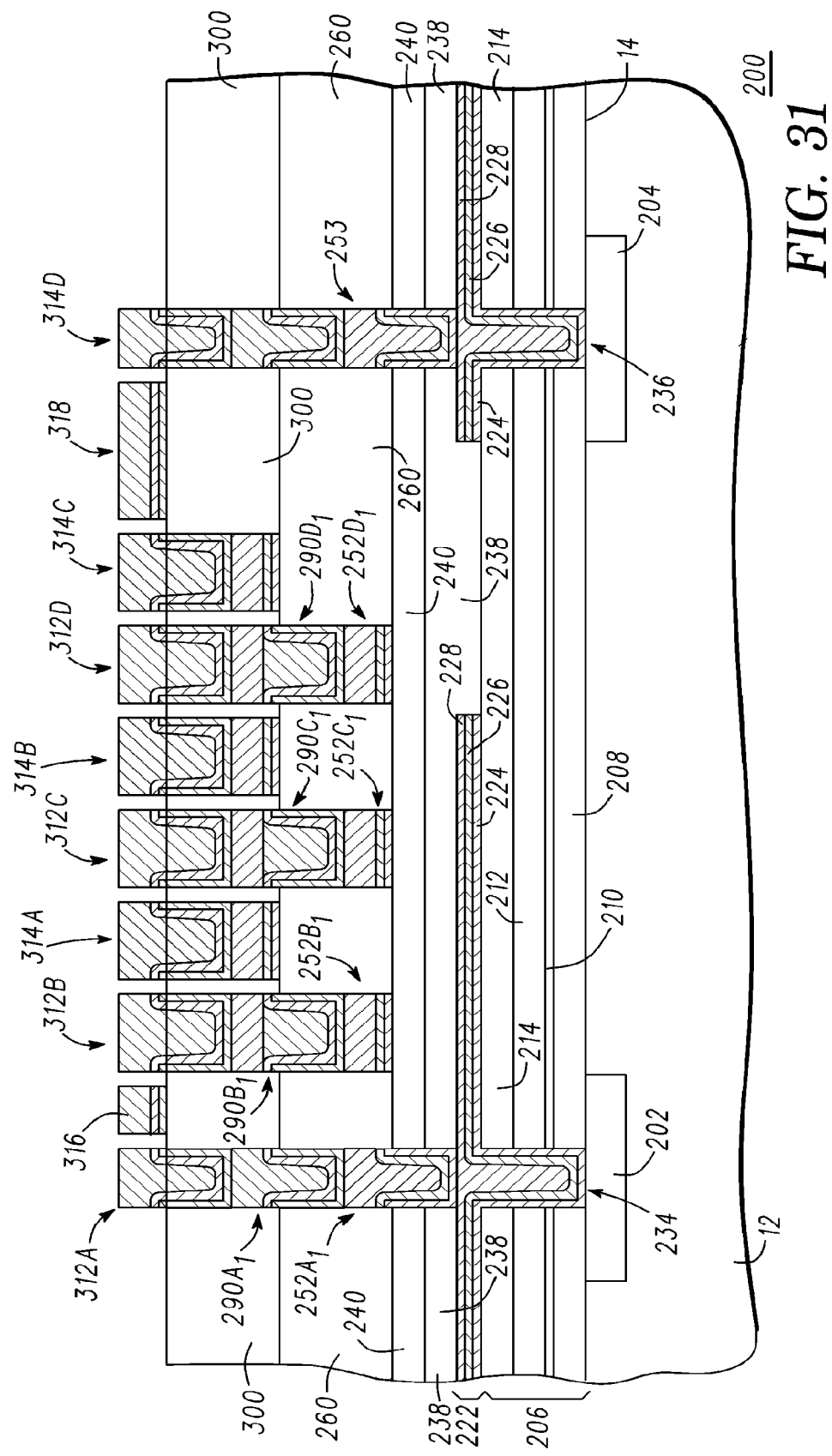
FIG. 31 is a cross-sectional view taken along section line 31-31 of FIG. 30.

FIGS. 31 and 32 are cross-sectional views of semiconductor component 200 taken along section lines 31-31 and 32-32 of FIG. 30. The descriptions of FIGS. 31 and 32 follows from those of FIGS. 28 and 29, respectively. Masking structure 310 is removed and the portions of barrier structure 302 exposed by the removal of masking structure 310 are removed using, for example, an anisotropic reactive ion etch.

Referring now to FIG. 33, terminal 316 is coupled to contact 314A$_2$ via a bonding wire 330, contact 314A$_1$ is coupled to contact 314B$_2$ via a bonding wire 332, contact 314B$_1$ is coupled to contact 314C$_2$ via bonding wire 334, contact 314C$_1$ is coupled to contact 314D$_2$ via a bonding wire 336. Contact 312B$_1$ is coupled to contact 312A$_2$ via a bonding wire 340, contact 312C$_1$ is coupled to contact 312B$_2$ via a bonding wire 342, contact 312D$_1$ is coupled to contact 312C$_2$ via a bonding wire 344, and terminal 318 is coupled to contact 312D$_2$ via a bonding wire 346. Contact 312A$_1$ and terminal 318 serve as input and output terminals of a coil 320 and terminal 316 and contact 314D$_1$ serve as input and output terminals of a coil 322. Coils 320 and 322 cooperate to form a common mode choke. Bonding wires are also referred to as wirebonds.

Figure 34:
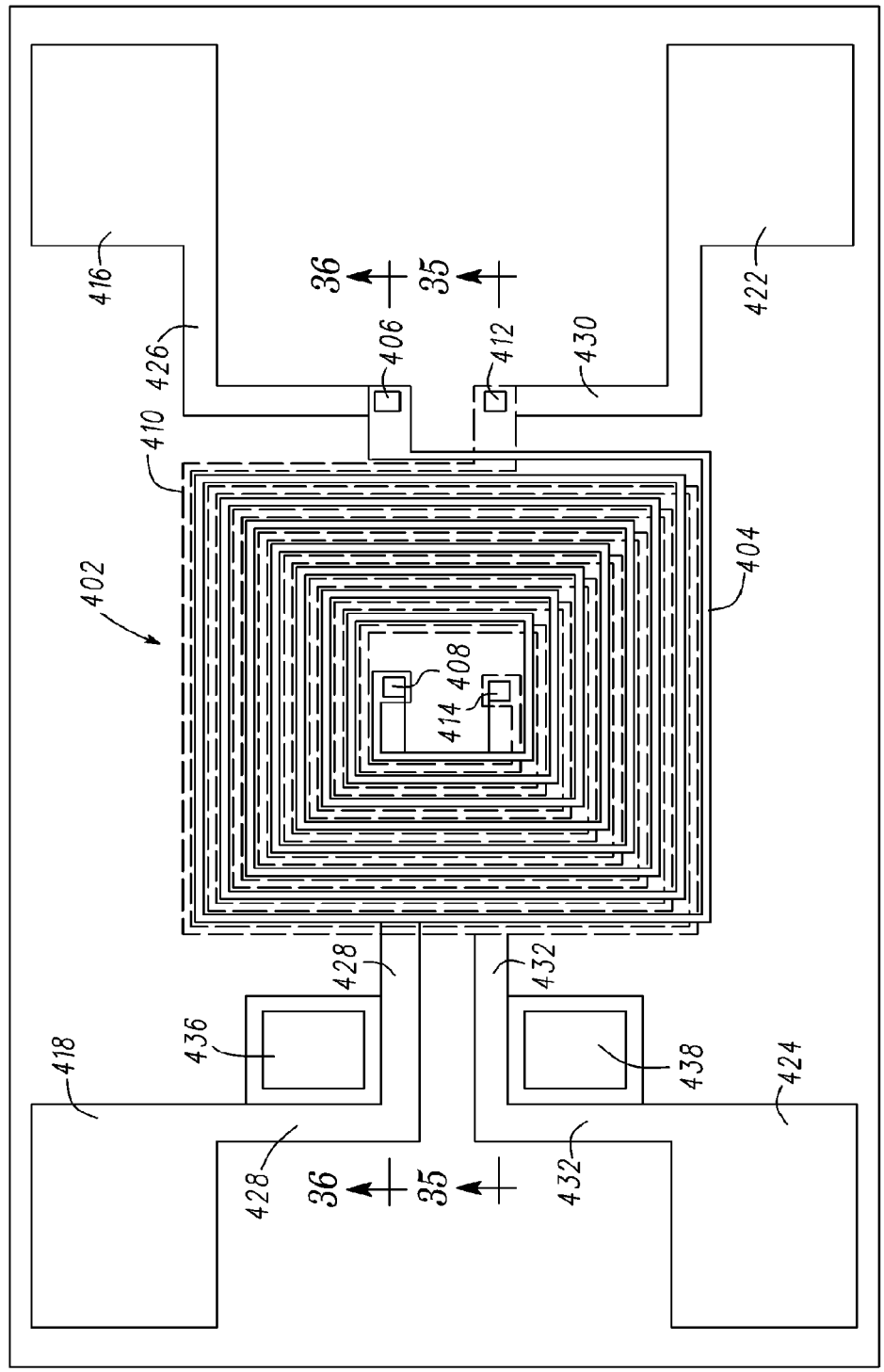
FIG. 34 is a top view of a semiconductor component in accordance with another embodiment of the present invention.

FIG. 34 is a top view of a semiconductor component 400 in accordance with another embodiment of the present invention. What is shown in FIG. 34 is a top view of a common mode choke 402 comprising a coil 404 having terminals 406 and 408 and a coil 410 having terminals 412 and 414. Terminals 406 and 408 are coupled to bond pads 416 and 418 though interconnects 426 and 428, respectively, and terminals 412 and 414 are coupled to bond pads 422 and 424 through interconnects 430 and 432, respectively. FIG. 34 further shows transient voltage suppression devices 436 and 438 coupled to terminals 408 and 414 through interconnects 428 and 432, respectively. In addition, transient voltage suppression devices (not shown) may be coupled to terminals 406 and 412. Alternatively, transient voltage suppression devices may be coupled to terminals 406 and 412 rather than to terminals 408 and 414.

FIG. 35 is a cross-sectional view of a portion of semiconductor component 400 taken along section line 35-35 of FIG. 34, but at an earlier stage of manufacture in accordance with another embodiment of the present invention. What is shown in FIG. 35 is semiconductor material 12 having major surface 14. Semiconductor material 12 has been described with reference to FIG. 1. In addition, FIG. 35 illustrates a transient voltage suppression device, a dielectric structure 206, electrically conductive layers 224, 226, and 228, and a passivation layer 238, which have been described with reference to FIGS. 13 and 14. The transient voltage suppression device is identified by reference character 438 and may be similar to transient voltage suppression device 202 described with reference to FIGS. 13 and 14. Electrically conductive layers 224, 226, and 228 have been etched to form interconnect structures 430 and 432. Typically transient voltage suppression device 438 is connected to interconnect structure 432 through an electrical interconnect (not shown). A layer of photoresist is formed on passivation layer 238 and patterned to have openings 454 and 456 that expose portions of passivation layer 238. The remaining portions of the photoresist layer serve as a masking structure 458.

FIG. 36 is a cross-sectional view of a portion of semiconductor component 400 taken along section line 36-36 of FIG. 34, but at an earlier stage of manufacture. FIG. 36 further illustrates openings 460 and 462 formed in the layer of photoresist described in FIG. 35. It should be noted that in accordance with the alternative embodiment, openings such as openings 460 and 462 are formed in passivation layer 238 because it is a photosensitive material and assumes the function of the photoresist layer and masking structure 458. A transient voltage suppression device 436 is illustrated in FIG. 36 and may be similar to transient voltage suppression device 202 described with reference to FIGS. 13 and 14. Electrically conductive layers 224, 226, and 228 have been etched to form interconnect structures 453 and 455. Typically transient voltage suppression device 436 is connected to interconnect structure 453 through an electrical interconnect (not shown). It should be noted that FIGS. 35 and 36 represent the same stage of the manufacture of semiconductor component 400, but at different locations. FIG. 36 illustrates transient voltage suppression device 436.

FIGS. 37 and 38 are cross-sectional views of semiconductor component 400 of FIGS. 35 and 36, respectively, at a later stage of manufacture. Openings are formed in passivation layer 238 to expose portions of interconnect structures 450 and 452 and a polyimide layer 240 is formed over passivation layer 238 and in the openings that expose the portions of interconnect structures 450 and 452. Openings are formed in polyimide layer 240 to re-expose the portions of interconnect structures 450 and 452. An electrically conductive barrier structure 241 is formed over polyimide layer 240 and in the openings exposing interconnect structures 450 and 452. Techniques for forming polyimide layer 240, openings in polyimide layer 240, and electrically conductive barrier structure 241 have been described with reference to FIG. 15. A layer of photoresist is formed on polyimide layer 240 and patterned to have openings 466 that expose portions of polyimide layer 240. The remaining portions of the photoresist layer serve as a masking structure 468. Alternatively, passivation layer 240 may be comprised of a photosensitive material that can be patterned like photoresist to form a masking structure. In this alternative embodiment, the photoresist and masking structure 468 would be absent because their function may be realized by passivation layer 240.

Figures 40, 41:
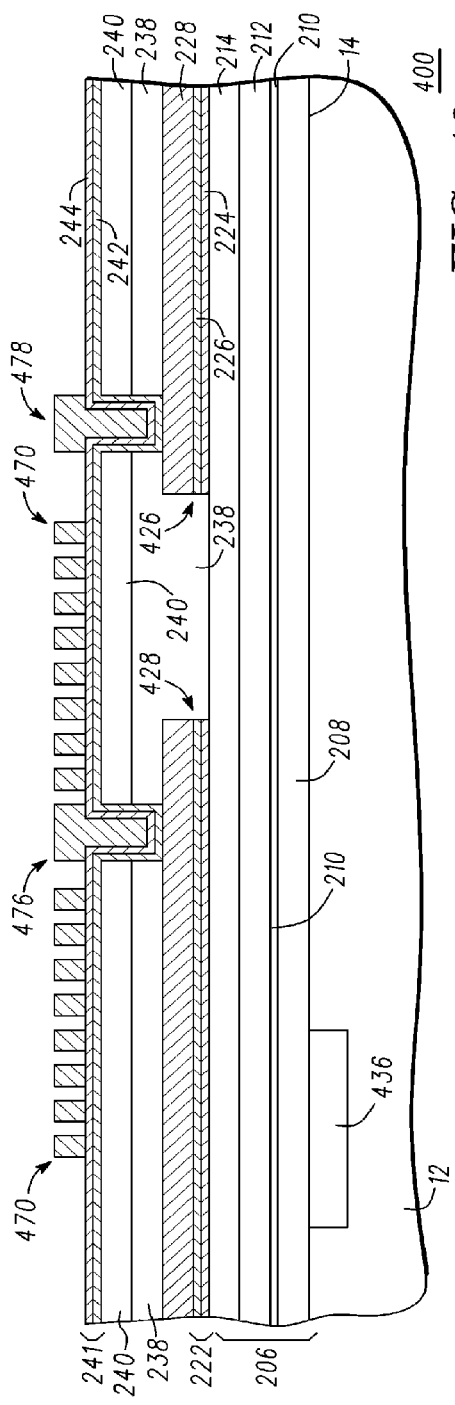
FIG. 40 is a cross-sectional view of the semiconductor component of FIG. 38 at a later stage of manufacture.
FIG. 41 is a cross-sectional view of the semiconductor component of FIG. 39 at a later stage of manufacture.

FIGS. 39 and 40 are cross-sectional views of semiconductor component 400 of FIGS. 37 and 38, respectively, at a later stage of manufacture. A layer of electrically conductive material such as, for example, copper is formed in openings 466 to form coils 470 and contacts 472, 474, 476, and 478. Techniques for forming coils 470 and contacts 472, 474, 476, and 478 are similar to those for forming electrically conductive strips 252A-252D discussed with reference to FIGS. 17-19.

Figure 42:
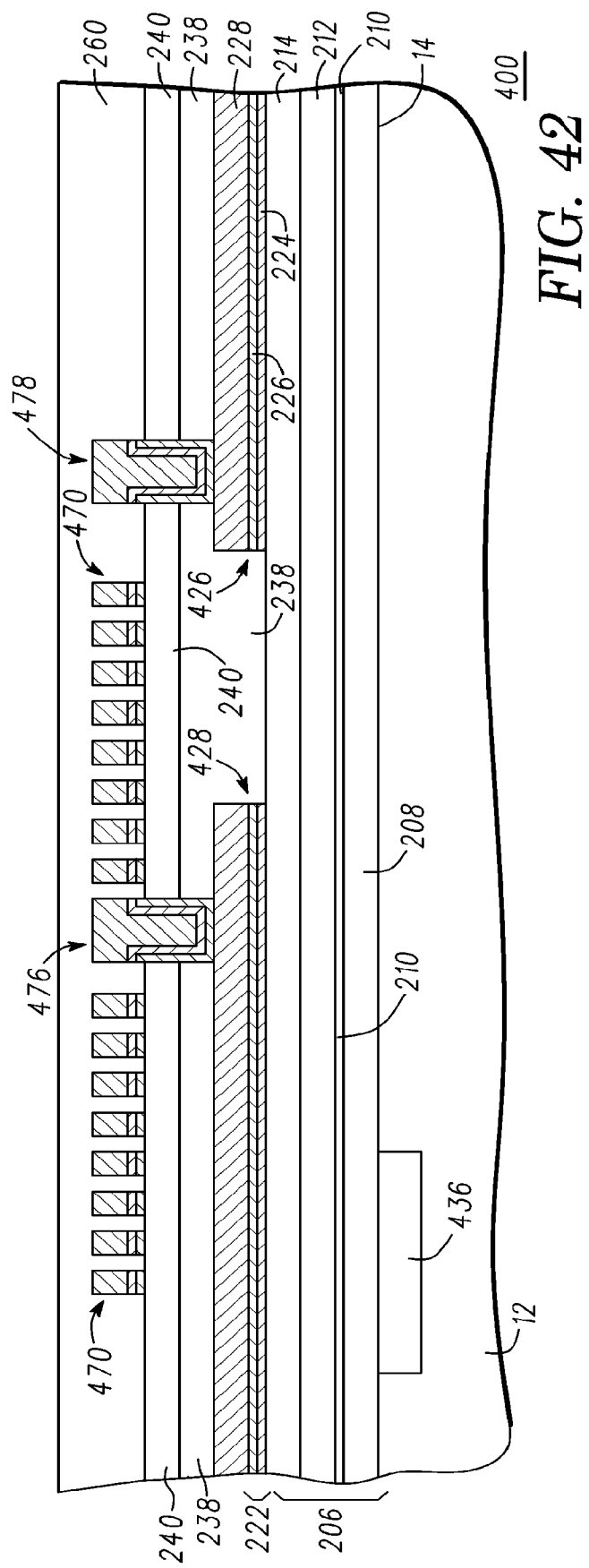
FIG. 42 is a cross-sectional view of the semiconductor component of FIG. 40 at a later stage of manufacture.

Referring now to FIGS. 41 and 42, cross-sectional views of semiconductor component 400 of FIGS. 39 and 40, respectively, at a later stage of manufacture are illustrated. The portions of electrically conductive barrier structure 241 exposed by the removal of the photoresist layer are anisotropically etched to expose portions of polyimide layer 240. A polyimide layer 260 is formed on coils 470, contacts 472, 474, 476, and 478, and on the exposed portions of polyimide layer 240. Formation of polyimide layer 260 is described with reference to FIGS. 23 and 24.

Figure 43:
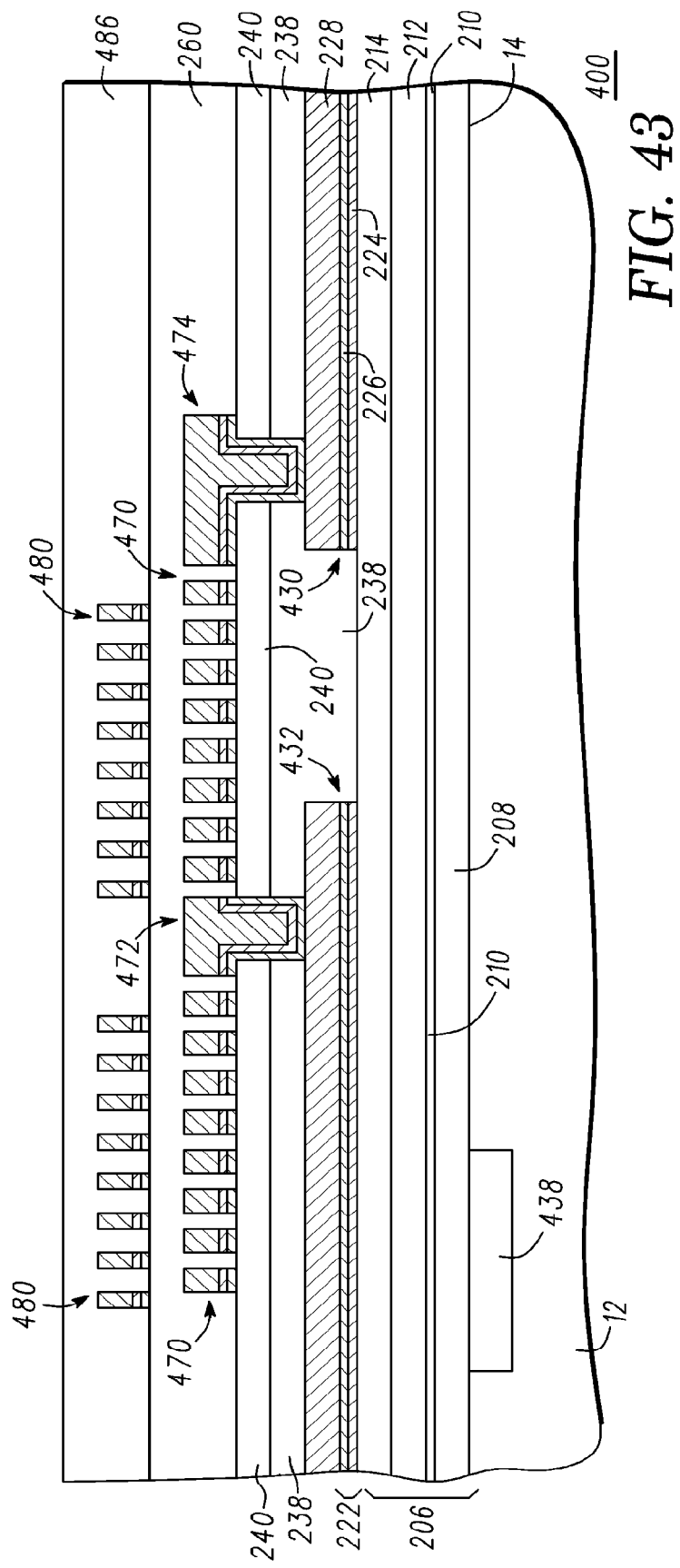
FIG. 43 is a cross-sectional view of the semiconductor component of FIG. 41 at a later stage of manufacture.
Figure 44:
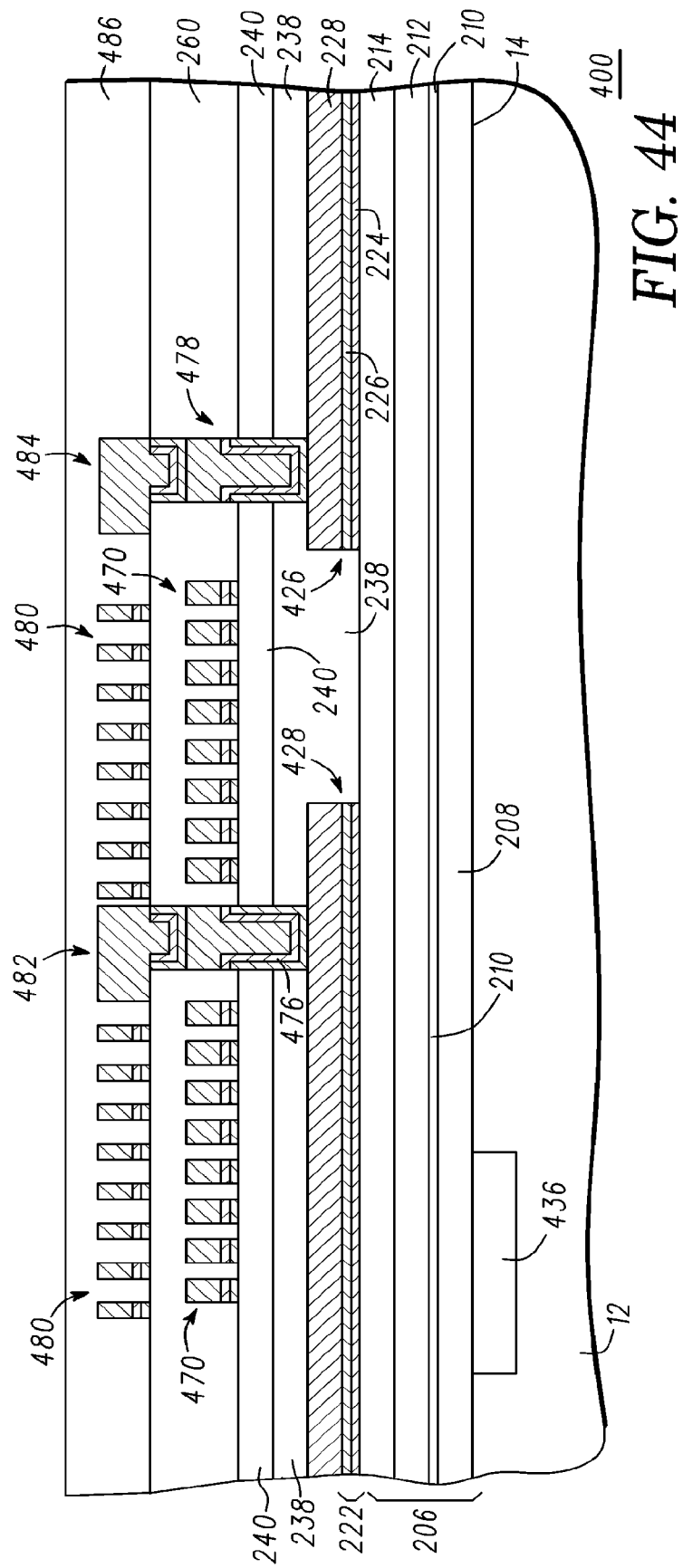
FIG. 44 is a cross-sectional view of the semiconductor component of FIG. 42 at a later stage of manufacture.

FIGS. 43 and 44 are cross-sectional views of semiconductor component 400 of FIGS. 41 and 42, respectively, taken at a later stage of manufacture. Coils 480 are formed over polyimide layer 260 using techniques similar to those described for forming electrically conductive strips 282A-282D with reference to FIGS. 25 and 26. In addition, contacts 482 and 484 are formed to be in contact with contacts 476 and 478, respectively. A passivation layer 486 is formed over passivation layer 260, coils 470 and 480, and contacts 472, 474, 476, and 478. By way of example, passivation layer 486 is polyimide.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
   providing a semiconductor material having a major surface;
   forming a first metallization system over the semiconductor material, the first metallization system comprising a first electrical contact to a first portion of the semiconductor material and a second electrical contact to a second portion of the semiconductor material;
   forming a first dielectric structure over the first metallization system;
   forming a first template over the first dielectric structure, the first template having openings that expose portions of the first dielectric structure;
   forming a second metallization system on the exposed portions of the first dielectric structure, the second metallization system comprising a first electrically conductive structure on a first portion of the first dielectric structure and a second electrically conductive structure on a second portion of the first dielectric structure, the first electrically conductive structure having a central region, a first end, and second end and the second electrically conductive structure having a central region, a first end, and a second end, the first metallization system formed so that the first electrically conductive structure is laterally adjacent to and electrically isolated from the second electrically conductive structure;
   forming a second dielectric structure over the second metallization system;
   forming a second template over the second dielectric structure, the second template having openings that expose portions of the second dielectric structure; and
   forming a third metallization system on the exposed portions of the second dielectric structure, the third metallization system comprising a third electrically conductive structure on a first portion of the second dielectric structure and a fourth electrically conductive structure on a fourth portion of the second dielectric structure, the third electrically conductive structure having a central region, a first end, and second end and the fourth electrically conductive structure having a central region, a first end, and a second end, the third metallization system formed so that the third electrically conductive structure is laterally adjacent to and electrically isolated from the fourth electrically conductive structure, and a portion of the central region of the third electrically conductive structure is laterally between a portion of the central region of the first electrically conductive structure and a portion of the central region of the second electrically conductive structure, and the portion of the central region of the second electrically conductive structure laterally is between the portion of the central region of the third electrically conductive structure and a portion of the central region of the fourth electrically conductive structure.

2. The method of claim 1, wherein forming the first template comprises forming a first photoresist structure over the first dielectric structure, the first photoresist structure having openings that expose the portions of the first dielectric structure.

3. The method of claim 2, wherein forming the second metallization system includes forming a first seed layer on the exposed portions of the first dielectric structure and electroplating a first electrically conductive material on the first seed layer.

4. The method of claim 3, wherein forming the second template comprises forming a second photoresist structure over the second dielectric structure, the second photoresist structure having openings that expose the portions of the second dielectric structure.

5. The method of claim 4, wherein forming the third metallization system includes forming a second seed layer on the exposed portions of the second dielectric structure and electroplating a second electrically conductive material on the second seed layer.

6. The method of claim 1, wherein forming the first dielectric structure includes forming a first layer of polyimide and forming the second dielectric structure includes forming a second layer of polyimide.

\* \* \* \* \*